US012787719B2

(12) United States Patent
Otsuki

(10) Patent No.: US 12,787,719 B2
(45) Date of Patent: Nov. 3, 2026

(54) SUBSTRATE PROCESSING METHOD AND SUBSTRATE PROCESSING APPARATUS USING INFRARED SPECTROSCOPY WITH P-POLARIZED INFRARED LIGHT

(71) Applicant: Tokyo Electron Limited, Tokyo (JP)

(72) Inventor: Yuji Otsuki, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 347 days.

(21) Appl. No.: 18/579,056

(22) PCT Filed: Jul. 7, 2022

(86) PCT No.: PCT/JP2022/026952
§ 371 (c)(1),
(2) Date: Jan. 12, 2024

(87) PCT Pub. No.: WO2023/002854
PCT Pub. Date: Jan. 26, 2023

(65) Prior Publication Data

US 2024/0321650 A1 Sep. 26, 2024

(30) Foreign Application Priority Data

Jul. 21, 2021 (JP) ................................. 2021-120366

(51) Int. Cl.
*H10P 74/00* (2026.01)
*G01N 21/3563* (2014.01)
*H10P 72/00* (2026.01)

(52) U.S. Cl.
CPC ......... *H10P 74/23* (2026.01); *G01N 21/3563* (2013.01); *H10P 72/0604* (2026.01); *G01N 2021/3568* (2013.01)

(58) Field of Classification Search
CPC ...... H10P 74/23; H10P 72/0604; H10P 14/60; H10P 74/203; H10P 50/242; H10P 74/00;
(Continued)

(56) References Cited

U.S. PATENT DOCUMENTS 6,879,051 B1 * 4/2005 Singh .................... C23C 16/045 257/762
2003/0147075 A1 * 8/2003 Otsuki .................... G01N 1/24 356/338
2012/0014508 A1 * 1/2012 Wormington ............. G01T 7/00 378/71

FOREIGN PATENT DOCUMENTS

JP H08-186103 A 7/1996
JP H10-056010 A 2/1998

(Continued)

*Primary Examiner* — Duy T Nguyen
(74) *Attorney, Agent, or Firm* — Armstrong Teasdale LLP

(57) ABSTRACT

In a first measuring process, P-polarized infrared light is emitted onto a substrate at a first incident angle at which an interference signal becomes smaller than a change by light absorption by the substrate, and light transmitted through or reflected from the substrate is measured. In a substrate processing process, substrate processing is performed on the substrate after the first measuring process. In a second measuring process, after substrate processing, P-polarized infrared light is emitted onto the substrate at a second incident angle at which an interference signal becomes smaller than a change caused by light absorption by the substrate, and light transmitted through or reflected from the substrate is measured. In an extraction process, a difference spectrum between the spectrum of the transmitted light or reflected light measured in the first measuring process and the transmitted light or reflected light measured in the second measuring process is extracted.

21 Claims, 22 Drawing Sheets

(58) Field of Classification Search
CPC ........ G01N 21/3563; G01N 2021/3568; C23C 16/44
USPC .............................................................. 438/5
See application file for complete search history.

(56) References Cited

FOREIGN PATENT DOCUMENTS

| | | | |
|---|---|---|---|
| KR | 10-2009-0115065 | A | 11/2009 |
| KR | 10-2010-0077145 | A | 7/2010 |
| KR | 10-2018-0106797 | A | 10/2018 |

* cited by examiner

SUBSTRATE PROCESSING METHOD AND SUBSTRATE PROCESSING APPARATUS USING INFRARED SPECTROSCOPY WITH P-POLARIZED INFRARED LIGHT

CROSS-REFERENCE TO RELATED APPLICATIONS

The present application is a U.S. National Stage Entry of International Patent Application No. PCT/JP2022/026952, filed Jul. 7, 2022, which claims the benefit of priority to Japanese Patent Application No. 2021-120366, filed Jul. 21, 2021, each of which is hereby incorporated herein by reference in its entirety.

TECHNICAL FIELD

The present disclosure relates to a substrate processing method and a substrate processing apparatus.

BACKGROUND

Patent Document 1 discloses a technique in which a substrate for film formation and a substrate for monitoring are placed to form a film thereon, the film formed on the substrate for monitoring is analyzed by using infrared spectroscopy, and the quality of the film formed on the substrate for film formation is optimized based on analysis values.

PRIOR ART DOCUMENT

Patent Document

Patent Document 1: Japanese Laid-Open Patent Publication No. h10-56010

The present disclosure provides a technique of detecting the state of a substrate due to substrate processing.

SUMMARY

A substrate processing method according to an aspect of the present disclosure includes a first measuring process, a substrate processing process, a second measuring process, and an extraction process. In the first measuring process, P-polarized infrared light is emitted at a first incident angle onto a substrate on which a pattern including a recess is formed, and light transmitted through the substrate or light reflected from the substrate is measured. In the substrate processing process, substrate processing is performed on the substrate after the first measuring process. In the second measuring process, after the substrate processing process, P-polarized infrared light is emitted at a second incident angle onto the substrate subjected to the substrate processing, and light transmitted through the substrate or light reflected from the substrate is measured. In the extraction process, a difference spectrum between a spectrum indicating the absorbance of infrared light for each wavenumber of the transmitted light or reflected light measured in the first measuring process and a spectrum indicating the absorbance of infrared light for each wavenumber of the transmitted light or reflected light measured in the second measuring process is extracted. The first incident angle and the second incident angle are incident angles at which an interference signal becomes smaller than a change caused by light absorption by the substrate in the spectrum of the transmitted light or reflected light obtained when the emitted P-polarized infrared light passes through or is reflected by the substrate.

According to the present disclosure, the state of a substrate due to substrate processing can be detected.

DETAILED DESCRIPTION

Hereinafter, embodiments of a substrate processing method and a substrate processing apparatus disclosed herein will be described in detail with reference to the drawings. The substrate processing method and the substrate processing apparatus disclosed herein are not limited by the embodiments.

In the manufacture of semiconductor devices, a film is formed on a substrate, such as a semiconductor wafer, on which a pattern including a recess is formed, by using a film forming apparatus. In the film forming apparatus, a substrate is disposed inside a chamber (a processing container) having a predetermined degree of vacuum, and plasma is generated while a raw material gas for film formation is being supplied into the chamber, so that film formation is performed on the substrate. As film forming techniques, for example, chemical vapor deposition (CVD) and atomic layer deposition (ALD) are known.

As patterns formed on substrates become increasingly finer, the quality of the films on the side walls and the bottoms of the recesses included in the patterns tends to deteriorate in film formation using plasma. Infrared spectroscopy is often used to analyze whether a film formed on a substrate has a desired composition and film quality. Specifically, film formation is performed on a flat substrate for monitoring separately from an actual substrate on which semiconductor devices are to be manufactured, and the film formed on the flat substrate for monitoring is analyzed by infrared spectroscopy, thereby inferring the state of the film formed on the actual substrate.

However, the state of the formed film differs between the actual substrate and the substrate for monitoring, and even if the film formed on the substrate for monitoring is analyzed by infrared spectroscopy, the state of the film formed on the actual substrate cannot be determined. Furthermore, in the infrared spectroscopy, interference signals may be generated due to the influence of multiple reflections of infrared light inside a sample, and it is difficult to detect the state of a film formed on the substrate due to the influence of the interference signals.

A problem to be solved has been described by using an example in which the state of a substrate (sample), such as a film formed on a substrate on which a pattern including recesses is formed, is detected by infrared spectroscopy. However, such a problem occurs when various kinds of substrate processing such as film formation, etching, and modification are performed on a substrate on which a pattern including recesses is formed, and the state of the sample due to the substrate processing is detected by infrared spectroscopy.

Therefore, there are expectations for technique that detects the state of a sample due to substrate processing.

EMBODIMENT

[Configuration of Film Forming Apparatus]

Figure 1:
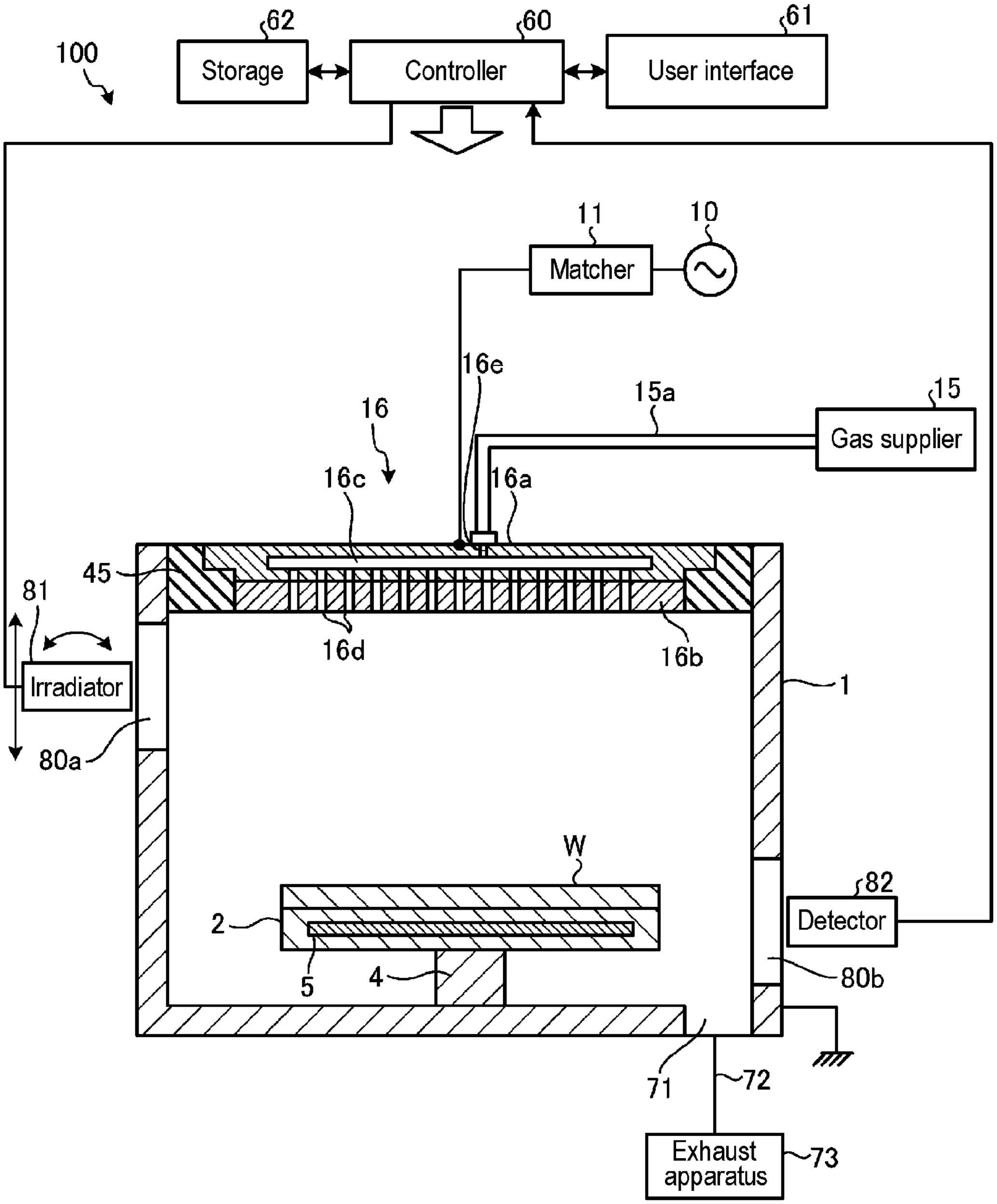
FIG. 1 is a schematic cross-sectional view illustrating an example of a film forming apparatus according to an embodiment.

Next, embodiments will be described. First, an example of a substrate processing apparatus of the present disclosure will be described. Hereinbelow, a case where the substrate processing apparatus of the present disclosure is referred to as a film forming apparatus 100 and the film forming apparatus 100 performs film formation as substrate processing will be mainly described. FIG. 1 is a schematic cross-sectional view schematically illustrating an example of the configuration of a film forming apparatus 100 according to an embodiment. In the present embodiment, the film forming apparatus 100 corresponds to the substrate processing apparatus of the present disclosure. The film forming apparatus 100 is an apparatus that forms a film on a substrate W in an embodiment. The film forming apparatus 100 illustrated in FIG. 1 includes a chamber 1 that is configured to be airtight and electrically connected to a ground potential. The chamber 1 has a cylindrical shape and is made of, for example, aluminum, nickel, or the like with an anodic oxide film formed on a surface thereof. A stage 2 is provided within the chamber 1.

The stage 2 is made of a metal such as aluminum or nickel. A substrate W such as a semiconductor wafer is placed on the top surface of the stage 2. The stage 2 horizontally supports the substrate W placed thereon. The bottom surface of the stage 2 is electrically connected to a support member 4 made of a conductive material. The stage 2 is supported by the support member 4. The support member 4 is supported on the bottom surface of the chamber 1. The lower end of the support member 4 is electrically connected to the bottom surface of the chamber 1 and is grounded via the chamber 1. The lower end of the support member 4 may be electrically connected to the bottom surface of the chamber 1 via a circuit that is adjusted to lower the impedance between the stage 2 and the ground potential.

A heater 5 is built in the stage 2 so that a substrate W placed on the stage 2 can be heated to a predetermined temperature by the heater 5. The stage 2 has a flow path (not illustrated) configured to circulate a coolant therein, and a temperature-controlled coolant may be circulated and supplied into the flow path by a chiller unit provided outside the chamber 1. The stage 2 may control the substrate W to a predetermined temperature by heating with the heater 5 and cooling with the coolant supplied from the chiller unit. The stage 2 may not be equipped with the heater 5, and the temperature of the substrate W may be controlled only by the coolant supplied from the chiller unit.

In addition, an electrode may be embedded in the stage 2. The stage 2 may attract the substrate W placed on the top surface thereof by an electrostatic force generated by a DC voltage supplied to the electrode.

Figure 2:
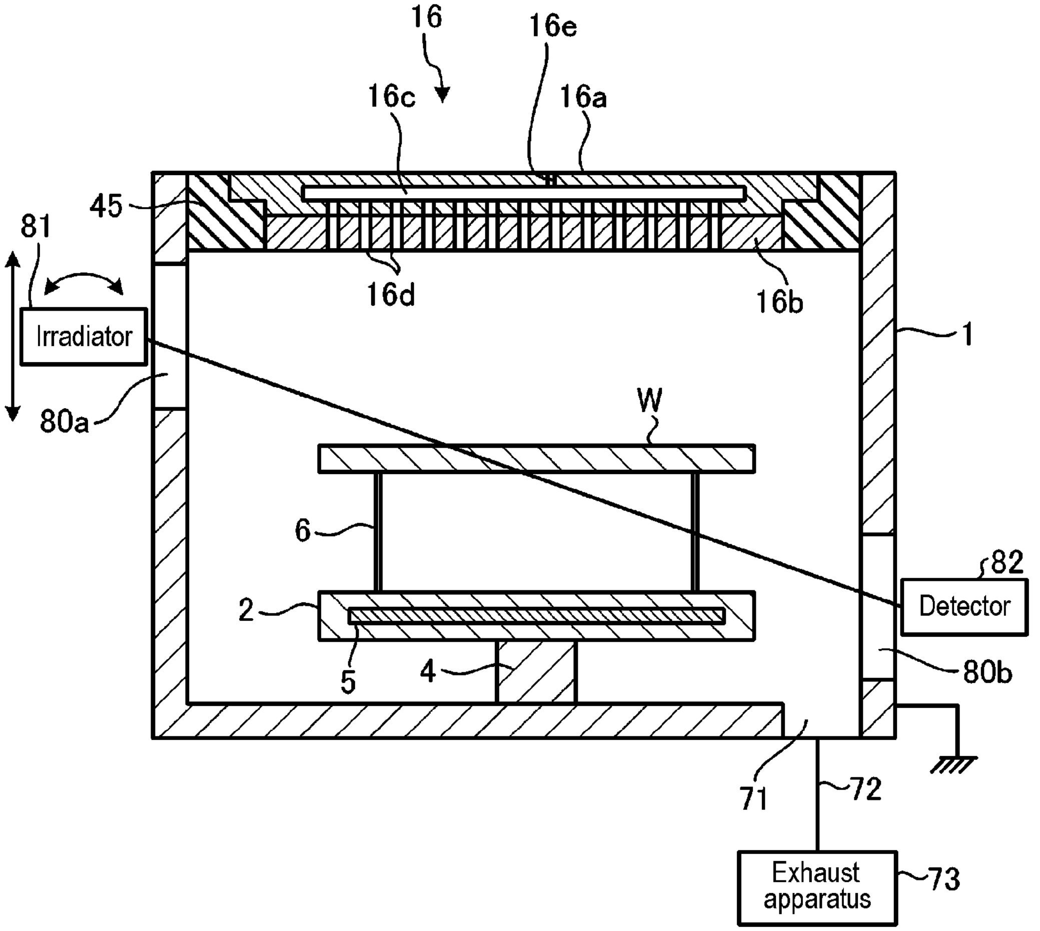
FIG. 2 is a view illustrating a state in which a substrate is raised from a stage in the film forming apparatus according to the embodiment.

The stage 2 is provided with lifter pins 6 for raising and lowering the substrate W. In the film forming apparatus 100, when the substrate W is transferred or when the substrate W is analyzed by IR spectroscopy, the lifter pins 6 are made to protrude from the stage 2, and the substrate W is supported from the rear surface and raised from the stage 2 by the lifter pins 6. FIG. 2 is a view illustrating a state in which the substrate W is lifted from the stage 2 in the film forming apparatus 100 according to the embodiment. A substrate W is transferred to the film forming apparatus 100. For example, a side wall of the chamber 1 is provided with a carry-in/out port (not illustrate) for carrying in or out a substrate W. The carry-in/out port is provided with a gate valve that opens and closes the carry-in/out port. When carrying in or out the substrate W, the gate valve is kept in the open state. The substrate W is carried into the chamber 1 from the carry-in/out port by a transfer mechanism (not illustrated) within a transfer chamber. The film forming apparatus 100 controls a lifting mechanism (not illustrated) provided outside the chamber 1 to raise the lifter pins 6 and receive the substrate W from the transfer mechanism. After the transfer mechanism exits, the film forming apparatus 100 controls the lifting mechanism to lower the lifter pins 6 and place the substrate W on the stage 2.

A substantially disk-shaped shower head 16 is provided on the inner surface of the chamber 1 above the stage 2. The shower head 16 is supported above the stage 2 via an insulating member 45 such as ceramic. As a result, the chamber 1 and the shower head 16 are electrically isolated from each other. The shower head 16 is made of a conductive metal such as nickel.

The shower head 16 has a ceiling plate member 16*a* and a shower plate 16*b*. The ceiling plate member 16*a* is provided to close the interior of the chamber 1 from the upper side. The shower plate 16*b* is provided below the ceiling plate member 16*a* to face the stage 2. A gas diffusion space 16*c* is formed in the ceiling plate member 16*a*. The ceiling plate member 16*a* and the shower plate 16*b* have a large number of gas ejection holes 16*d* distributed therein and opened towards the gas diffusion space 16*c*.

The ceiling plate member 16*a* has a gas inlet 16*e* configured to introduce various types of gases into the gas diffusion space 16*c* therethrough. A gas supply path 15*a* is connected to the gas inlet 16*e*. A gas supplier 15 is connected to the gas supply path 15*a*.

The gas supplier 15 includes gas supply lines, which are connected to respective gas sources of various gases used for film formation. Each gas supply line appropriately branches to correspond to a film forming process, and is provided with control devices for controlling a gas flow rate, such as a valve (e.g., an opening/closing valve) and a flow controller (e.g., a mass flow controller). The gas supplier 15 is configured to be capable of controlling the flow rates of various types of gases by controlling the control devices, such as an opening/closing valve and a flow controller provided in each gas supply line.

The gas supplier 15 supplies various types of gases used for film formation to the gas supply path 15*a*. For example, the gas supplier 15 supplies a raw material gas for film formation to the gas supply path 15*a*. In addition, the gas supplier 15 supplies a purge gas or a reaction gas that reacts with the raw material gas to the gas supply path 15*a*. The gas supplied to the gas supply path 15*a* is diffused in the gas diffusion space 16*c* and is ejected from each gas ejection hole 16*d*.

The space surrounded by the bottom surface of the shower plate 16*b* and the top surface of the stage 2 forms a processing space in which film formation is performed. In addition, the shower plate 16*b* is paired with the stage 2 and is configured as an electrode plate for forming capacitively coupled plasma (CCP) in the processing space. In addition, a radio-frequency power supply 10 is connected to the shower head 16 via a matcher 11. Plasma is formed in the processing space by applying radio-frequency power (RF power) from the RF power supply 10 to the gas supplied to the processing space 40 via the shower head 16 and supplying the gas from the shower head 16 at the same time. The RF power supply 10 may be connected to the stage 2 instead of being connected to the shower head 16, and the shower head 16 may be grounded. In the present embodiment, the shower head 16, the gas supplier 15, and the RF power supply 10, which perform film formation, correspond to the substrate processor of the present disclosure. In the present embodiment, the substrate processor performs film formation on a substrate W as substrate processing.

An exhaust port 71 is provided in the bottom portion of the chamber 1. An exhaust apparatus 73 is connected to the exhaust port 71 via an exhaust pipe 72. The exhaust apparatus 73 includes a vacuum pump, a pressure adjustment valve, and the like. The exhaust apparatus 73 is capable of reducing and adjusting the pressure inside the chamber 1 to a predetermined degree of vacuum by operating the vacuum pump and the pressure adjustment valve.

The film forming apparatus 100 according to the present embodiment performs infrared (IR) spectroscopy analysis on a substrate W within the chamber 1, and is capable of detecting the state of a film formed on the substrate W. The infrared spectroscopy includes a method of emitting infrared light to a substrate W and the light transmitted through the substrate W (transmitted light) is measured (transmission method), and a method in which the light reflected from the substrate W (reflected light) is measured (reflection method). The film forming apparatus 100 illustrated in FIG. 1 is an example in a case where the light transmitted through a substrate W is measured. The chamber 1 is provided with a window 80*a* and a window 80*b* on side walls facing each other with the stage 2 interposed therebetween. The window 80*a* is provided at a high position on the side wall. The window 80*b* is provided at a low position on the side wall. The windows 80*a* and 80*b* are sealed with, for example, a member such as quartz that is transparent to infrared light. An irradiator 81 configured to emit infrared light is provided outside the window 80*a*. A detector 82 capable of detecting infrared light is provided outside the window 80*b*.

When performing analysis using the transmission method of IR spectroscopy, the film forming apparatus 100 causes the lifter pins 6 to protrude from the stage 2 and raises the substrate W from the stage 2, as illustrated in FIG. 2. The positions of the window 80*a* and the irradiator 81 are adjusted such that the infrared light emitted from the irradiator 81 is emitted onto the top surface of the raised substrate W through the window 80*a*. In addition, the positions of the window 80*b* and the detector 82 are adjusted such that the transmitted light, which is infrared light transmitted through the raised substrate W, enters the detector 82 through the window 80*b*.

The irradiator 81 is arranged such that infrared light emitted therefrom hits a predetermined region in the vicinity of the center of the raised substrate W through the window 80*a*. For example, the irradiator 81 emits infrared light to a region of the substrate W in a range of about 1 to 10 mm. The detection part 82 is arranged such that the infrared light reflected from a predetermined region of the substrate W is incident thereon through the window 80*b*.

The film forming apparatus 100 according to the present embodiment detects the state of a film formed on the substrate W by determining the absorbance for each wavenumber of the light transmitted through the substrate W by using IR spectroscopy. Specifically, the film forming apparatus 100 detects a substance contained in the film formed on the substrate W by determining the absorbance for each wavenumber of light transmitted through the substrate W by using Fourier transform IR spectroscopy.

The irradiator 81 includes therein a light source that emits infrared light and optical elements such as a mirror and a lens to be capable of emitting interference infrared light. For example, the irradiator 81 splits the middle portion of an optical path of infrared light generated by the light source until the infrared light is emitted to the outside into two optical paths by using a half mirror or the like, and varies the length of one optical path relative to the length of the other optical path to cause interference, thereby emitting infrared light of various interference waves with different optical path differences. The irradiator 81 may be configured to include a plurality of light sources, and to control the infrared light of each light source with an optical element, thereby being capable of emitting infrared light of various interference waves with different optical path differences.

The detector 82 detects the signal intensity of the transmitted light due to infrared light of various interference waves transmitted through the substrate W. In the present embodiment, the components for performing IR spectroscopy measurement, such as the irradiator 81 and the detector 82, correspond to the measurement components in the present embodiment.

The operation of the film forming apparatus 100 configured as described above is totally controlled by a controller 60. A user interface 61 and a storage 62 are connected to the controller 60.

The user interface 61 may be configured as an operation part, such as a keyboard, on which a process manager inputs commands to manage the film forming apparatus 100, or a display part, such as a display, which visualizes and displays the operating state of the film forming apparatus 100. The user interface 61 accepts various operations. For example, the user interface 61 accepts a predetermined operation instructing the start of plasma processing.

The storage 62 stores programs (software) for implementing various processes performed in the film forming apparatus 100 under the control of the controller 60, or data such as processing conditions or process parameters. In addition, the programs or the data may be used in the state of being stored in a computer-readable computer storage medium (e.g., a hard disk, a CD, a flexible disk, or semiconductor memory). Alternatively, the programs or data may be transmitted from another device at any time via, for example, a dedicated line to be used online.

The controller 60 is, for example, a computer including a processor, memory, or the like. The controller 60 reads a program or data from the storage 62 based on an instruction from the user interface 61 or the like to control each component of the film forming apparatus 100, thereby executing the processing of a substrate processing method to be described later.

The controller 60 is connected to the irradiator 81 and the detector 82 via an interface (not illustrated) for inputting/outputting data, and inputs/outputs various kinds of information. The controller 60 controls the irradiator 81 and the detector 82. For example, the irradiator 81 emits various interference waves with different optical path differences based on control information from the controller 60. In addition, the controller 60 inputs information on the signal intensity of infrared light detected by the detector 82.

Figure 3:
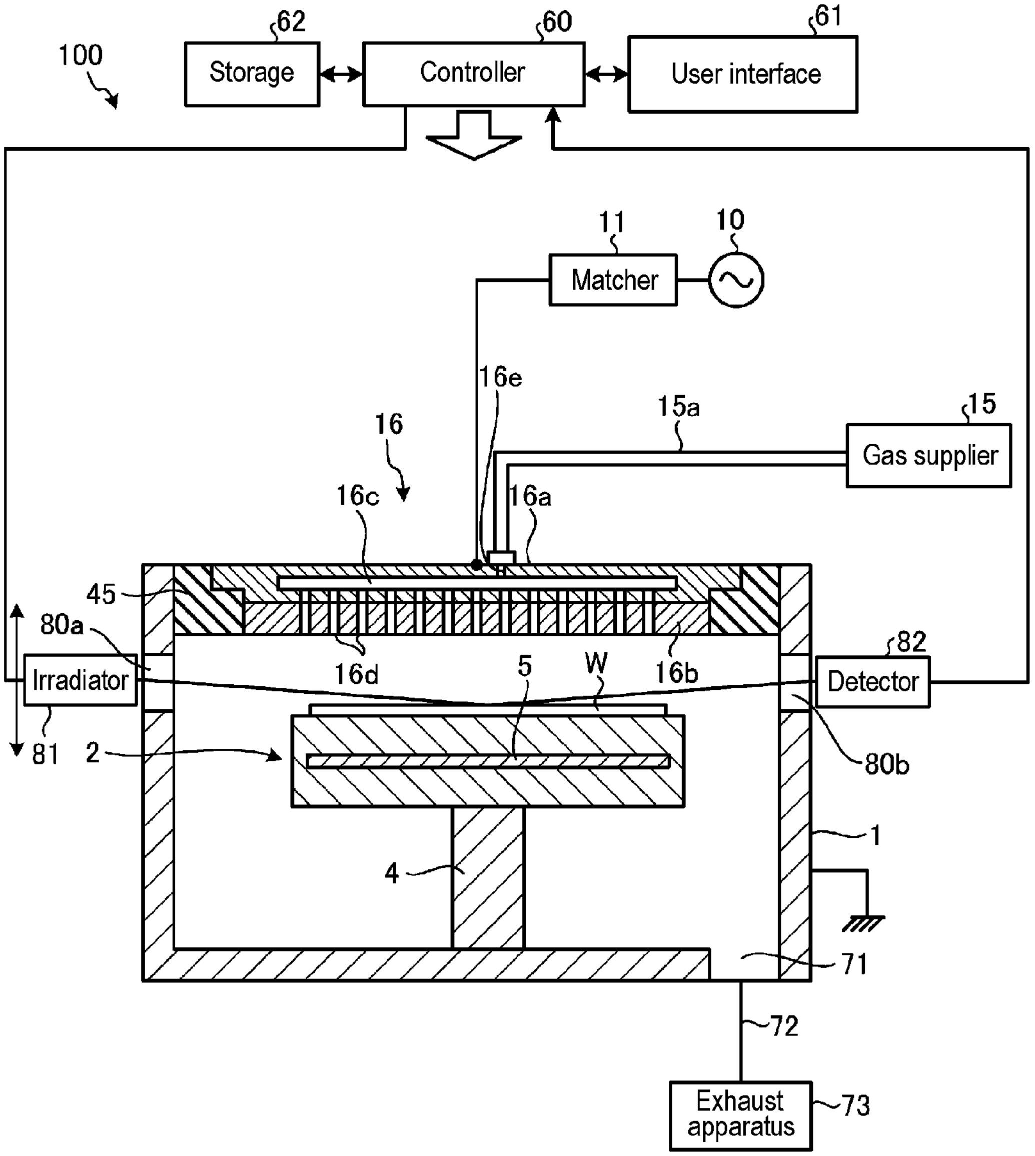
FIG. 3 is a schematic configuration view illustrating another example of the film forming apparatus according to the embodiment.

FIGS. 1 and 2 has illustrated an example in which the film forming apparatus 100 is configured to measure light transmitted through a substrate W so that analysis can be performed by using the transmission method of IR spectroscopy. However, the film forming apparatus 100 may be configured to enable analysis using the reflection method of IR spectroscopy. FIG. 3 is a schematic configuration view illustrating another example of the configuration of the film forming apparatus 100 according to the embodiment. The film forming apparatus 100 illustrated in FIG. 3 represents an example adopting a configuration in which light reflected from a substrate W is measured.

In the film forming apparatus 100 illustrated in FIG. 3, a window 80*a* and a window 80*b* are provided on the side walls of the chamber 1 at positions facing each other with the stage 2 interposed therebetween. An irradiator 81 configured to emit infrared light is provided outside the window 80*a*. A detector 82 capable of detecting infrared light is provided outside the window 80*b*. The positions of the window 80*a* and the irradiator 81 are adjusted such that the infrared light emitted from the irradiator 81 is emitted to a substrate W through the window 80*a*. In addition, the positions of the window 80*b* and the detector 82 are adjusted such that the infrared light reflected from the substrate W enters the detector 82 through the window 80*b*. On a side wall different from the windows 80*a* and 80*b* of the chamber 1, a carry-in/out port (not illustrated) is provided for carry-in/out of a substrate W. The carry-in/out port is provided with a gate valve that opens and closes the carry-in/out port.

The irradiator 81 is arranged such that infrared light emitted therefrom hits a predetermined region in the vicinity of the center of the substrate W through the window 80*a*. For example, the irradiator 81 emits infrared light to a region of the substrate W in a range of about 1 to 10 mm. The detector 82 is arranged such that the infrared light reflected from the predetermined region of the substrate W is incident thereon through the window 80*b*. In this way, the film forming apparatus 100 illustrated in FIG. 3 is configured to enable analysis using the reflection method of IR spectroscopy.

Figure 4:
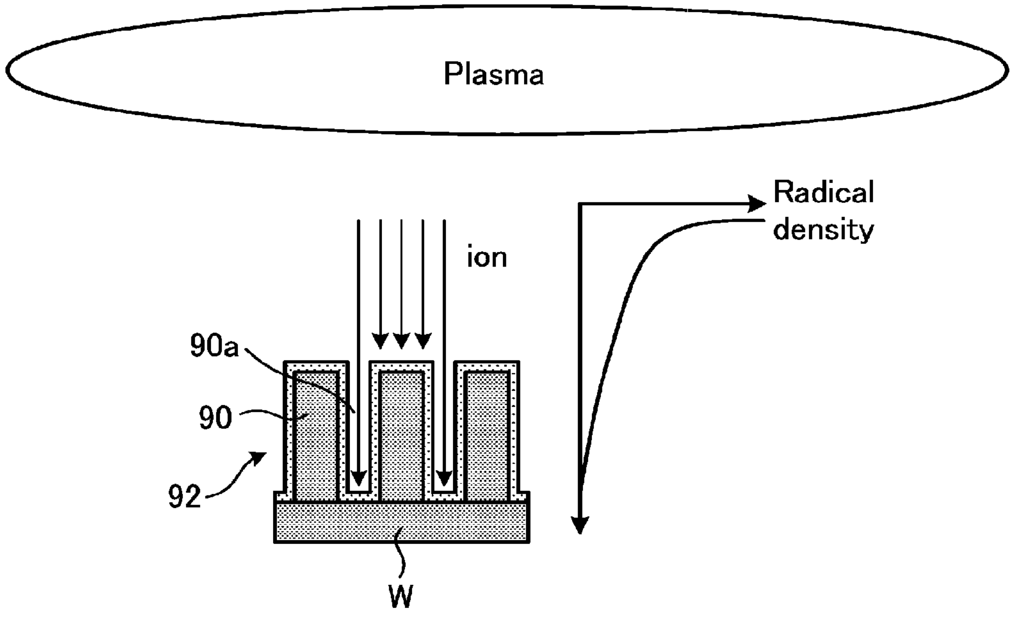
FIG. 4 is a view illustrating film formation using plasma according to an embodiment.
Figure 5:
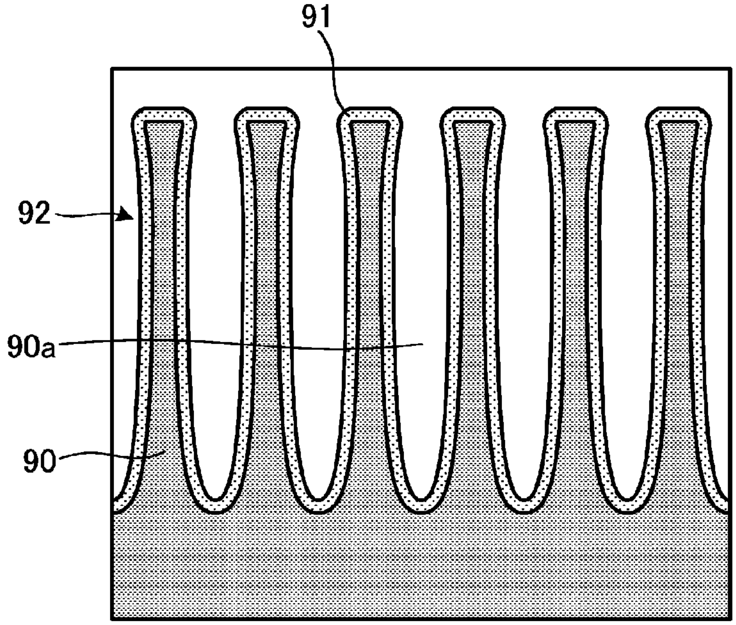
FIG. 5 is a view illustrating an example of a substrate on which a film is formed according to an embodiment.

Semiconductor devices have become increasingly smaller, and patterns formed on substrates W also have complex nanoscale shapes. In film formation using plasma, the film quality tends to deteriorate on the side walls and bottoms of recesses included in fine patterns. FIG. 4 is a view illustrating film formation using plasma according to an embodiment. In FIG. 4, a substrate W is illustrated. A pattern 90 including nanoscale recesses 90*a* is formed on the substrate W. For example, in FIG. 4, a trench 92 is formed in the substrate W as a pattern 90 including a plurality of recesses 90*a*. In the film formation using plasma, since ions and radicals have difficulty reaching the side walls and bottoms of the recesses 90*a*, the film quality on the side walls and bottoms of the recesses 90*a* tends to deteriorate. In order to improve the film quality, it is necessary to analyze the composition of the film on the side walls and bottoms of the recesses 90*a*. FIG. 5 is a view illustrating an example of a substrate W on which a film is formed according to an embodiment. FIG. 5 schematically illustrates the state in which a film 91 is formed through plasma ALD on a pattern 90 having recesses 90*a*. For example, in FIG. 5, a film 91 is formed in a trench 92 formed in a substrate W.

Examples of techniques for analyzing a formed film include IR spectroscopy such as Fourier transform IR (FT-IR) spectroscopy.

Figure 6:
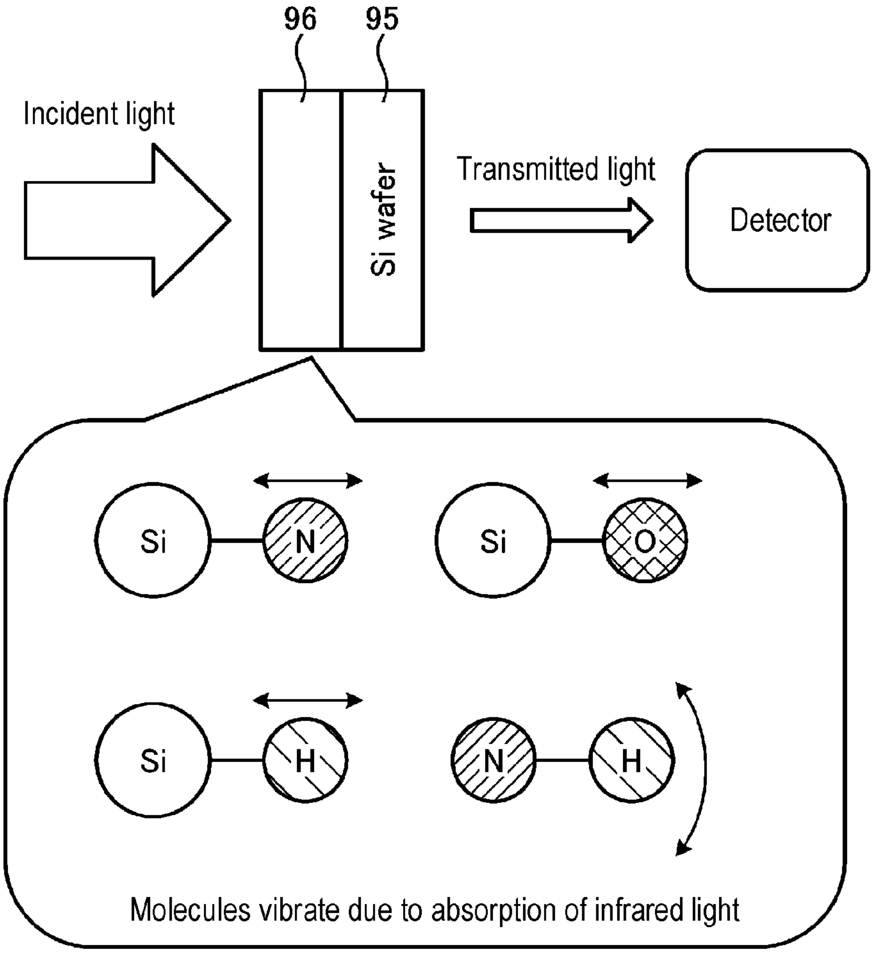
FIG. 6 is a view illustrating a conventional FT-IR analysis.

FIG. 6 is a view illustrating a conventional FT-IR analysis. Conventionally, in an FT-IR analysis, a film is formed on a flat substrate for monitoring, separate from an actual substrate W on which semiconductors are manufactured, infrared light is emitted to the substrate for monitoring, and light transmitted through the substrate for monitoring is analyzed, thereby inferring the state of the film formed on the actual substrate W. FIG. 6 schematically illustrates a state in which a film 96 is formed on a flat silicon substrate 95 for monitoring by plasma ALD under the same film forming conditions as the film 91. In FIG. 6, an FT-IR analysis is performed by emitting infrared light to the silicon substrate 95 and detecting light transmitted through the silicon substrate 95 with a detector. In the FT-IR analysis, a spectrum indicating the absorbance of infrared light for each wavenumber of the transmitted light is obtained. In the FT-IR analysis, information on chemical bonds is obtained from the spectrum. In addition, in the FT-IR analysis, the vibrations of atoms and molecules can be observed from the spectrum, and light atoms of hydrogen or the like can be detected. For example, in the film 96, since molecules vibrate by absorbing infrared light, chemical bonds such as SiN, SiO, SiH, and NH can be detected by the FT-IR analysis.

However, the states of formed films differ between the actual substrate W for manufacturing semiconductor devices and the silicon substrate 95 for monitoring, and even if the film 96 formed on the silicon substrate 95 is analyzed by using IR spectroscopy, the state of the film 91 formed on the substrate W cannot be determined.

Therefore, a possible method is to perform the following processing on the actual substrate W to detect the state of the film formed on the substrate W. For example, measurement is performed on the substrate W before film formation by IR spectroscopy. In addition, the substrate W after the film formation is measured by IR spectroscopy. A difference spectrum indicating the difference between a light spectrum measured on the substrate W before film formation and a light spectrum measured on the substrate W after film formation is extracted, and from the extracted difference spectrum, the state of the film formed on the substrate W is detected.

With the increasing integration and miniaturization, the aspect ratio of a pattern 90 formed on the substrate W increases, and the depth of the recesses 90*a* of the pattern 90 increases. For example, in the manufacture of 3D NAND, the depth of the recesses 90*a* of the pattern 90, such as trenches and vias, formed on the substrate W increase. In IR spectroscopy, when the depth of the recesses 90*a* of the pattern 90 formed on the substrate W approaches the wavelength of the infrared light, the intensity of an interference signal due to multiple reflections of infrared light within the pattern 90 increases significantly. Due to the influence of this interference signal, it is difficult to detect the state of the film formed on the substrate W.

Figure 7A:
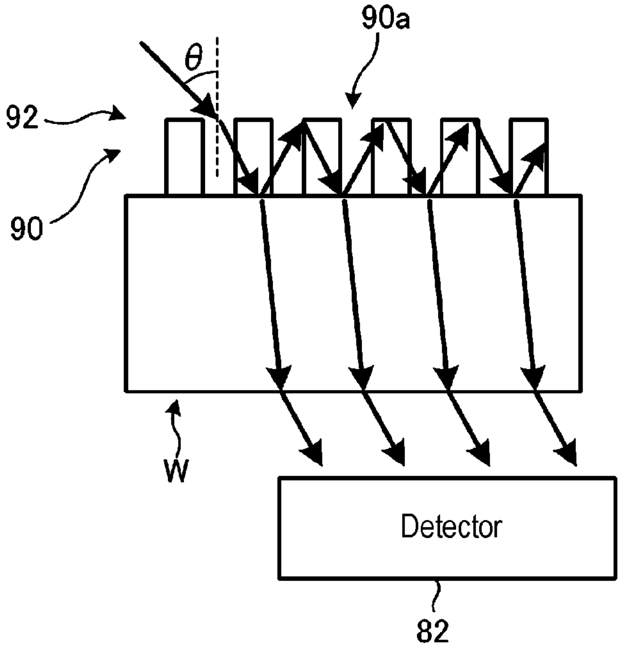
FIG. 7A is a view illustrating the cause of generation of an interference signal.
Figure 7B:
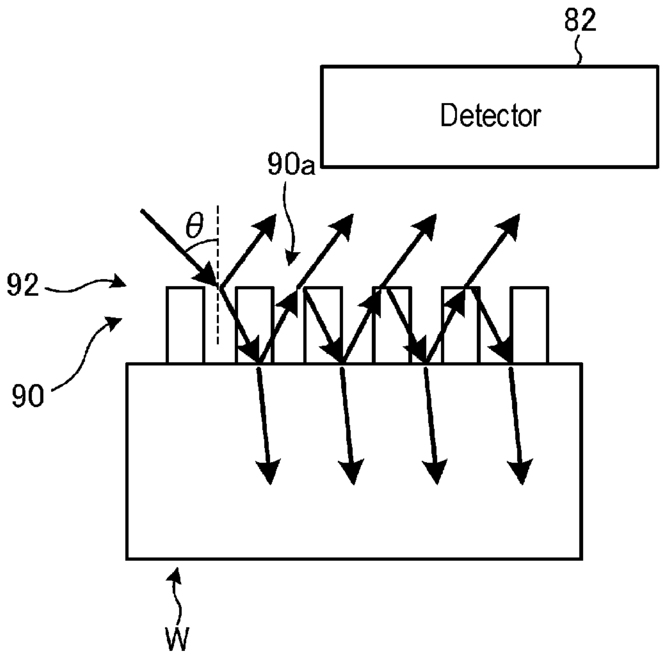
FIG. 7B is a view illustrating the cause of generation of an interference signal.
Figure 8:
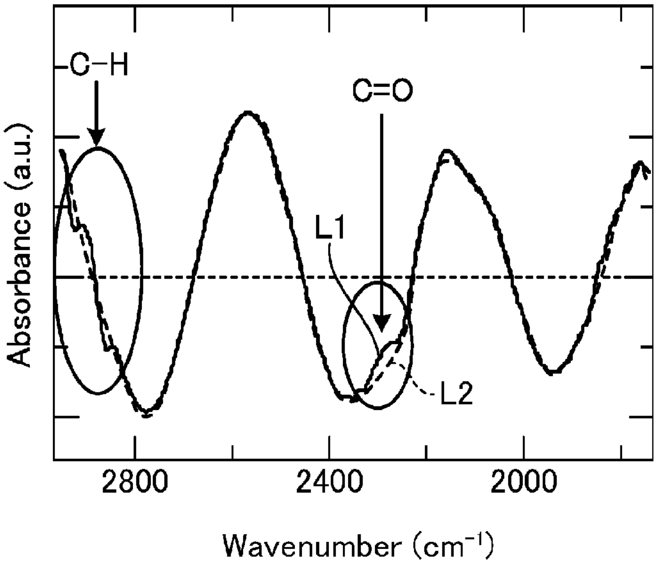
FIG. 8 is a view illustrating an example of analysis results.

FIGS. 7A and 7B are views illustrating the causes of interference signals. FIG. 7A illustrates a case where analysis is performed by using the transmission method of IR spectroscopy. FIG. 7B illustrates a case where analysis is performed using the reflection method of IR spectroscopy. In FIGS. 7A and 7B, a pattern 90 including recesses 90*a* with a depth of 700 nm or more is formed on a substrate W. When infrared light is emitted to such a substrate W, multiple reflections of the infrared light occur within the pattern 90 (trench 92). When the light transmitted through the substrate W is detected and analyzed by IR spectroscopy, as a result of analysis, an interference signal due to multiple reflections at the pattern 90 (trench 92) is generated. Such multiple reflections within a sample are called thin-film interference. FIG. 8 is a view illustrating an example of analysis results. FIG. 8 illustrates the results of IR spectroscopy analysis of a substrate W on which a film 91 containing C—H bonds and C═O bonds has been formed, illustrating the absorbance of infrared light transmitted through the substrate W (transmitted light) for each wavenumber. The horizontal axis of FIG. 8 represents the wavenumber of infrared light. The vertical axis represents the absorbance of infrared light. FIG. 8 illustrates a spectrum waveform L1 indicating absorbance for each wavenumber. In the waveform L1, periodic changes occur due to thin-film interference. In FIG. 8, components of periodic changes due to thin film interference are illustrated by a broken line as a waveform L2. The intensity of such an interference signal increases as the depth of the recesses 90*a* of the pattern 90 formed on the substrate W approaches the wavelength of the infrared light. Specifically, the interference signal becomes significant when the depth of the recesses 90*a* of the pattern 90 is 700 nm or more. In addition, the period of periodic change in the interference signal becomes shorter as the depth of the recesses 90*a* increase. In the waveform L1, the absorbance increases at a wavenumber position corresponding to a component of the composition contained in the substrate W. For example, in the waveform L1, the absorbance changes at wavenumber positions corresponding to C—H bonds and C—O bonds. However, in the waveform L1, due to the influence of periodic changes in the interference signal, it is difficult to distinguish changes in absorbance due to C—H bonds and C—O bonds. For example, it is difficult to determine where to set a baseline, and quantitative results vary depending on how the baseline is drawn.

Figure 9:
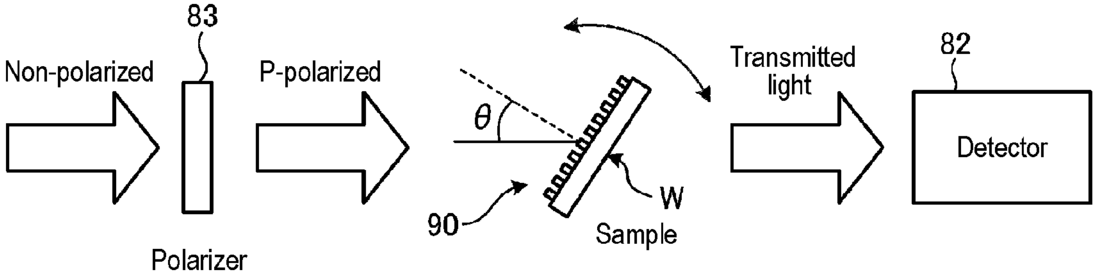
FIG. 9 is a view illustrating control of the incident angle of infrared light with respect to a substrate and the polarization of the infrared light.
Figure 10:
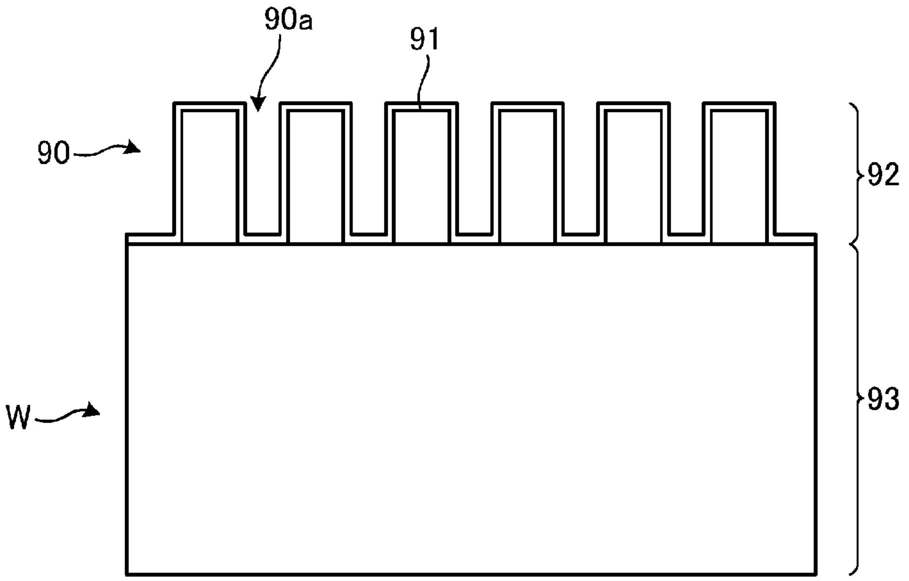
FIG. 10 is a view schematically illustrating a substrate according to an embodiment.
Figure 11:
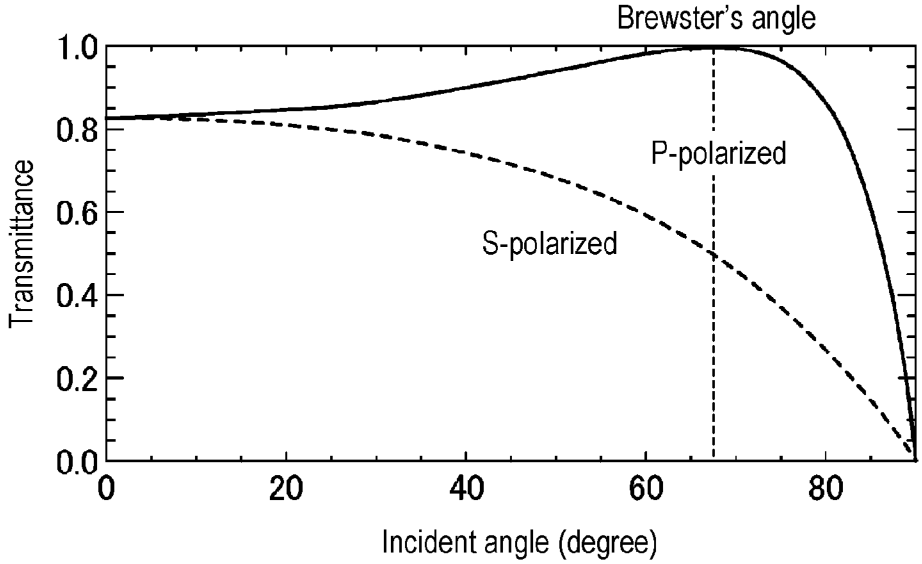
FIG. 11 is a view illustrating an example of a change of an incident angle of infrared light on a substrate and transmittance.

Multiple reflections of infrared light in a portion of the pattern 90 of the substrate W can be reduced by controlling the incident angle of the infrared light with respect to the substrate W and the polarization of the infrared light. FIG. 9 is a view illustrating control of the incident angle of infrared light with respect to a substrate W and the polarization of the infrared light. A polarizer 83 that transmits only P-polarized infrared light is provided in the optical path of the infrared light. FIG. 9 illustrates an example in which unpolarized infrared light is emitted to the polarizer 83, the P-polarized infrared light transmitted through the polarizer 83 is emitted onto a substrate W, and the detector 82 detects the light transmitted through the substrate W. A pattern 90 is illustrated on the substrate W. The P-polarized infrared light is reflected at the interface between the pattern 90 and its base film depending on the incident angle θ with respect to the substrate W. FIG. 10 is a view schematically illustrating a substrate W according to an embodiment. A pattern 90 including nanoscale recesses 90*a* is formed on the substrate W. For example, in FIG. 10, a trench 92 is formed in the substrate W as a pattern 90 including a plurality of recesses 90*a*. Some of the P-polarized infrared light is reflected from the interface between the trench 92 and the base film 93 of the trench 92, depending on the incident angle θ with respect to the substrate W. The transmittance of the P-polarized infrared light transmitted through the interface between the pattern 90 and its base film changes depending on the incident angle θ with respect to the substrate W. FIG. 11 is a view illustrating an example of an incident angle of infrared light on a substrate W versus a change in transmittance. FIG. 11 illustrates changes in transmittance versus changes in the incident angle of P-polarized infrared light and S-polarized infrared light with respect to a substrate W. The transmittance of S-polarized infrared light decreases as the incident angle increases. On the other hand, when the incident angle of P-polarized infrared light increases, the transmittance increases once to 1 (100%) and then decreases. The incident angle at which the transmittance is 1 is called a Brewster's angle. At the Brewster's angle, all P-polarized infrared light is transmitted through the interface between the pattern 90 and its base film. This Brewster's angle changes depending on the components of the film 91 or the like. On the substrate W, even when P-polarized infrared light is incident at the Brewster's angle, for example, some of the polarized infrared light is reflected at an interface other than the interface between the pattern 90 and the base film, such as the interface between the pattern 90 and the air or the interface between the base film 93 and air. Therefore, even when P-polarized infrared light is incident on the substrate W at the Brewster's angle, analysis by the reflection method of infrared spectroscopy is possible.

Therefore, the film forming apparatus 100 according to the embodiment is configured such that a polarizer 83 that transmits only P-polarized infrared light is provided in the optical path of the infrared light of the irradiator 81, so that the P-polarized infrared light is emitted from the irradiator 81.

In addition, in the film forming apparatus 100 according to the embodiment, measurement is performed by using infrared spectroscopy by emitting the P-polarized infrared light at a first incident angle onto the substrate W before film formation. In addition, in the film forming apparatus 100, measurement is performed by using infrared spectroscopy by emitting the P-polarized infrared light at a second incident angle onto the substrate W after film formation. The first incident angle and the second incident angle are set to incident angles at which an interference signal becomes smaller than a change caused by light absorption by the substrate W, in a spectrum of light obtained when emitted P-polarized infrared light is transmitted through or reflected from the substrate W. In the film forming apparatus 100 according to the embodiment illustrated in FIG. 1, the first incident angle and the second incident angle are set to incident angles at which an interference signal becomes smaller than a change caused by light absorption by the substrate W in a spectrum of light obtained when emitted P-polarized infrared light is transmitted through the substrate. In the film forming apparatus 100 according to the embodiment illustrated in FIG. 3, the first incident angle and the second incident angle are set to incident angles at which an interference signal becomes smaller than a change caused by light absorption by the substrate W in a spectrum of light obtained when emitted P-polarized infrared light is reflected from the substrate. The first incident angle and the second incident angle may be the same as or different from each other. The first incident angle and the second incident angle may be determined in advance. A method for specifying the first incident angle and the second incident angle will be described later.

In the film forming apparatus 100 according to the embodiment, the position of the irradiator 81 may be adjusted and arranged such that P-polarized infrared light emitted from the irradiator 81 is incident on a predetermined region of a substrate W at the first incident angle and the second incident angle. For example, in the film forming apparatus 100 illustrated in FIG. 1, the position of the irradiator 81 may be adjusted and arranged such that P-polarized infrared light emitted from the irradiator 81 is incident on a predetermined region of a substrate W raised by protruding the lifter pins 6 from the stage 2 at the first incident angle and the second incident angle. In addition, in the film forming apparatus 100, the position of the detector 82 may be adjusted and arranged such that the light transmitted through a predetermined region of the substrate W enters the detector 82 through the window 80*b*. In addition, in the film forming apparatus 100 illustrated in FIG. 3, the position of the irradiator 81 may be adjusted and arranged such that P-polarized infrared light emitted from the irradiator 81 is incident on a predetermined region of a substrate W placed on the stage 2 at the first incident angle and the second incident angle. In addition, in the film forming apparatus 100, the position of the detector 82 may be adjusted and arranged such that the light reflected from a predetermined region of the substrate W enters the detector 82 through the window 80*b*. The first incident angle and the second incident angle are set to incident angles within a predetermined angle range with reference to the Brewster's angle of emitted P-polarized infrared light with respect to a substrate W. The interference signal changes continuously with respect to the incident angle, and even if the incident angle deviates slightly from the Brewster's angle, the intensity of the interference signal becomes small. The predetermined angle range may be any angle range in which the signal level of the interference signal is equal to or lower than the signal level due to a substance contained in the substrate W. For example, the predetermined angle range may be a range of −40° to +10° from the Brewster's angle, and is preferably a range of −30° to +7.5° from the Brewster's angle and more preferably a range of −20° to +5° from the Brewster's angle. Regarding the angle range, a negative range indicates that the incident angle becomes smaller and the light is incident more perpendicularly to the substrate W. In addition, a positive range indicates that the incident angle becomes larger and the light is incident on the substrate W from a more horizontal direction. The first incident angle and the second incident angle may be the same as or different from each other. For example, the first incident angle and the second incident angle are set to the Brewster's angle of the emitted P-polarized infrared light with respect to the substrate W.

In addition, the film forming apparatus 100 according to the embodiment may be configured to be able to change the incident angle of P-polarized infrared light that is incident on the substrate W from the irradiator 81. For example, in FIGS. 1 and 3, the irradiator 81 is configured to be movable and rotatable in the vertical direction by a drive mechanism (not illustrated), so that the incident angle of P-polarized infrared light incident on a substrate W from the irradiator 81 can be changed. The controller 60 changes the position and rotation angle of the irradiator 81 to adjust the incident angle of P-polarized infrared light onto the substrate W to the first incident angle or the second incident angle. The first incident angle and the second incident angle may be specified by the film forming apparatus 100, may be specified from the user interface 61, or may be specified from another device via a network or the like.

A method for specifying the first incident angle and the second incident angle will be described. Hereinbelow, a case where the first incident angle and the second incident angle are specified by using the film forming apparatus 100, which is configured to be able to change the incident angle of P-polarized infrared light that is incident on a substrate W from the irradiator 81 as illustrated in FIGS. 1 and 3 will be described as an example.

For example, the film forming apparatus 100 according to the embodiment performs a measurement for adjustment by using an actual substrate W. In the measurement for adjustment, the substrate W having a front surface on which a pattern 90 including recesses 90*a* is formed is placed on the stage 2. In the film forming apparatus 100, P-polarized infrared light is emitted at a plurality of incident angles onto a substrate W, and the light transmitted through or reflected from the substrate W is measured at each of the incident angles. For example, when measuring transmitted light as illustrated in FIG. 1, the controller 60 causes the lifter pins 6 to protrude from the stage 2, supports the substrate W from the rear surface with the lifter pins 6, and raises the substrate W from the stage 2. The controller 60 changes the position and rotation angle of the irradiator 81, P-polarized infrared light is emitted at a plurality of incident angles from the irradiator 81 to the substrate W, and the detector 82 detects the light transmitted through the substrate at each of the incident angles. When measuring reflected light as illustrated in FIG. 3, it is not necessary to raise the substrate W by using the lifter pins 6.

From the data detected by the detector 82, the controller 60 obtains a spectrum indicating the absorbance of infrared light for each wavenumber of transmitted light or reflected light at each incident angle for the plurality of incident angles. The spectrum for each incident angle includes an interference signal caused by thin-film interference. The interference signal changes depending on the incident angle. The controller 60 determines the incident angle at which the interference signal is the smallest from the spectrum of transmitted light or reflected light measured at each of the incident angles. For example, in the spectrum at each incident angle, depending on each substance contained in the substrate W, the signal level of a wavenumber corresponding to the substance changes. Therefore, depending on a substance contained in the substrate W, the wavenumber range in which the change in signal level is small is determined. For example, in the substance contained in the substrate W, a wavenumber range in which no change in signal level occurs is defined as the wavenumber range in which the change in signal level is small. When the amplitude of the periodic intensity change of the spectrum at each incident angle changes for a wavenumber range in which the change in signal level due to a substance contained in the substrate W is small, it is presumed that the change in amplitude is due to an interference signal. The controller 60 compares the signal level in the wavenumber range in which the change in signal level due to a substance contained in the substrate W is small with respect to the spectrum of each incident angle, and determines the incident angle at which the interference signal is the smallest. For example, the controller 60 determines the amplitude of periodic intensity changes within a wavenumber range in which the change in signal level is small from the spectrum of each incident angle, and determines the incident angle at which the amplitude is the smallest. Then, the controller 60 determines the incident angle at which the interference signal is the smallest from among the plurality of incident angles at which the light is actually emitted onto the substrate W. In addition, the controller 60 may analyze the relationship between the incident angles and the peaks of signal levels by using regression analysis or the like based on the peaks of signal levels at a plurality of incident angles at which light is actually emitted onto the substrate W, and determine the incident angle at which the peak of signal level is the smallest. For example, the controller 60 may determine, as the incident angle at which the peak of the signal level is the smallest, an incident angle from the relationship between the incident angles and the peaks of signal levels obtained by regression analysis. That is, the controller 60 may determine an incident angle other than the plurality of incident angles at which the light is actually emitted onto the substrate W as the incident angle at which the peak of the signal level is the smallest.

The controller 60 specifies the first incident angle and the second incident angle from the incident angle at which the interference signal is the smallest. For example, the controller 60 specifies the first incident angle and the second incident angle as the incident angle at which the interference signal is the smallest. The film forming apparatus 100 may reduce interference signals included in the spectrum of transmitted light or reflected light measured at each of the first incident angle and the second incident angle by setting the first incident angle and the second incident angle to the incident angle at which the interference signal is the smallest.

Here, even if the first incident angle and the second incident angle are slightly deviated from the incident angle at which the interference signal is the smallest, the interference signal can be made sufficiently small.

Therefore, the controller 60 may specify the first incident angle and the second incident angle from a predetermined angle range with reference to the incident angle at which the interference signal is the smallest. The predetermined angle range may be any angle range in which the signal level of the interference signal is equal to or lower than the signal level due to a substance contained in the substrate W. For example, the predetermined angle range may be a range of −40° and +10° from the incident angle at which the interference signal is the smallest, and is preferably a range of −30° and +7.5° from the incident angle at which the interference signal is the smallest and more preferably a range of −20° to +5° from the incident angle at which the interference signal is the smallest. For example, the controller 60 specifies the first incident angle and the second incident angle from the range of −40° to +10° from the incident angle at which the interference signal is the smallest. The first incident angle and the second incident angle may be the same as or different from each other.

In addition, the film forming apparatus 100 according to the embodiment may perform a measurement for adjustment on a substrate W before film formation on which a film is to be formed and a substrate W after film formation on which a film has been formed. The substrate W after film formation may be a substrate on which film formation has been performed by using the film forming apparatus 100, or may be a substrate on which film formation has been performed by using another film forming apparatus.

In this case, in the measurement for adjustment, the substrate W before film formation is placed on the stage 2. In the film forming apparatus 100, P-polarized infrared light is emitted at a plurality of incident angles onto the substrate W before film formation, and the light transmitted through or reflected from the substrate W is measured at each of the incident angles. The controller 60 determines the incident angle at which the interference signal becomes the smallest from the spectrum of light transmitted through the substrate W before film formation. In addition, in the measurement for adjustment, the substrate W after film formation is placed on the stage 2. In the film forming apparatus 100, P-polarized infrared light is emitted onto the substrate W after film formation at a plurality of incident angles, and the transmitted light of the substrate W is measured at each of the incident angles. The controller 60 determines the incident angle at which the interference signal is the smallest from the spectrum of the light transmitted through or reflected from the substrate W after film formation. The controller 60 specifies the first incident angle and the second incident angle from the incident angle at which the interference signal is the smallest on the substrate W before film formation and the incident angle at which the interference signal is the smallest on the substrate W after film formation.

For example, the controller 60 may specify the first incident angle from a predetermined angle range with reference to the incident angle at which the interference signal is the smallest on the substrate W before film formation. The predetermined angle range may be any angle range in which the signal level of the interference signal is equal to or lower than the signal level due to a substance contained in the substrate W. For example, the predetermined angle range may be a range of −40° and +10° from the incident angle at which the interference signal is the smallest on the substrate before film formation, and is preferably a range of −30° and +7.5° from the incident angle at which the interference signal is the smallest and more preferably a range of −20° to +5° from the incident angle at which the interference signal is the smallest. For example, the controller 60 specifies the first incident angle from the range of −40° to +10° from the incident angle at which the interference signal is the smallest on the substrate W before film formation. In addition, the controller 60 may specify the second incident angle from a predetermined angle range with reference to the incident angle at which the interference signal is the smallest on the substrate W after film formation. The predetermined angle range may be any angle range in which the signal level of the interference signal is equal to or lower than the signal level due to a substance contained in the substrate W. For example, the predetermined angle range may be a range of −40° and +10° from the incident angle at which the interference signal is the smallest on the substrate after film formation, and is preferably a range of −30° and +7.5° from the incident angle at which the interference signal is the smallest and more preferably a range of −20° to +5° from the incident angle at which the interference signal is the smallest. For example, the controller 60 specifies the second incident angle from the range of −40° to +10° from the incident angle at which the interference signal is the smallest on the substrate W after film formation.

In addition, for example, the controller 60 may specify the first incident angle and the second incident angle as the same angle from a predetermined angle range with reference to the intermediate angle between the incident angle at which the interference signal is the smallest on the substrate W before film formation and the incident angle at which the interference signal is the smallest on the substrate W after film formation. For example, the controller 60 may specify the first incident angle and the second incident angle as the same angle from a predetermined angle range with reference to the intermediate angle between the incident angle at which the interference signal is the smallest on the substrate W before film formation and the incident angle at which the interference signal is the smallest on the substrate W after film formation. The predetermined angle range may be any angle range in which the signal level of the interference signal is equal to or lower than the signal level due to a substance contained in the substrate W. For example, the predetermined angle range may be a range of −40° to +10° from the intermediate angle, and is preferably a range of −30° to +7.5° from the intermediate angle and more preferably a range of −20° to +5° from the intermediate angle. For example, the controller 60 specifies the first incident angle and the second incident angle as the same angle from the range of −40° to +10° from the intermediate angle between the incident angle at which the interference signal is the smallest on the substrate W before film formation and the incident angle at which the interference signal is the smallest on the substrate W after film formation.

A Brewster's angle may be calculated from a refractive index. For example, a Brewster's angle at an interface between a trench 92 and a base film 93 as illustrated in FIG. 10 can be calculated from the refractive indices of a portion of the trench 92 and a portion of the base film 93. Assuming that the refractive index of the portion of the trench 92 is $n_{trench}$ and the refractive index of the portion of the base film 93 is $n_{substrate}$, the Brewster angle $\theta_B$ can be calculated from Equation (1) below.

$$\theta_B = \mathrm{Arctan}(n_{substrate}/n_{trench}) \tag{1}$$

For example, a pattern 90 including recesses 90*a* of a substrate W is formed of air and silicon (Si), and the volume ratio of air and silicon is 0.35. In this case, $n_{trench}$ can be calculated from Equation (2) below.

$$n_{trench} = 0.65n_{si} + 0.35n_{air} = 0.65 \times 3.5 + 0.35 \times 1 = 2.63 \tag{2}$$

Here, $n_{si}$ is the refractive index of silicon.

$n_{air}$ is the refractive index of the recesses, that is, the air.

In this case, the Brewster's angle $\theta_B$ can be calculated as 53° from Equation (1) as represented in Equation (3) below.

$$\theta_B = \mathrm{Arctan}(3.5/2.63) = 53 \text{ degrees} \tag{3}$$

Therefore, the controller 60 may specify the first incident angle and the second incident angle by calculation without performing a measurement for adjustment. For example, the controller 60 calculates the Brewster's angle by calculation from the refractive index of the portion of the pattern 90 (the portion of the trench 92) formed on the substrate W and the refractive index of the base layer (base film 93) of the portion of the pattern 90. The controller 60 may specify the first incident angle and the second incident angle from a predetermined angle range with reference to the calculated Brewster's angle. The predetermined angle range may be any angle range in which the signal level of the interference signal is equal to or lower than the signal level due to a substance contained in the substrate W. For example, the predetermined angle range may be a range of −40° to +10° from the Brewster's angle, and is preferably a range of −20° to +5° from the Brewster's angle and more preferably a range of −30° to +7.5° from the Brewster's angle. For example, the controller 60 specifies the first incident angle and the second incident angle from the range of −40° to +10° from the Brewster's angle.

Figure 12:
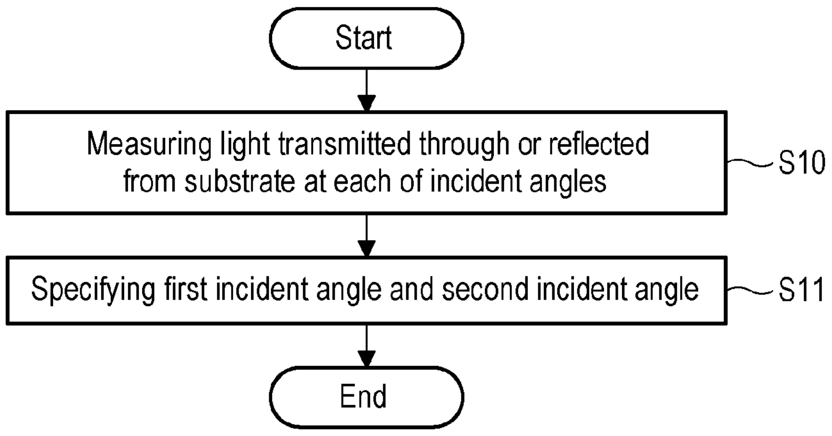
FIG. 12 is a flowchart illustrating an example of the flow of a specifying method according to an embodiment.

Next, a flow of processing performed by the film forming apparatus 100 according to the embodiment will be described. First, a flow of a method for specifying the first incident angle and the second incident angle by the film forming apparatus 100 according to the embodiment will be described. FIG. 12 is a flowchart illustrating an example of the flow of a specifying method according to an embodiment.

First, P-polarized infrared light is emitted to a substrate W at a plurality of incident angles, and the light transmitted through or reflected from the substrate W is measured at each of the incident angles (step S10). For example, the substrate W having a front surface on which a pattern 90 including recesses 90*a* is formed is placed on the stage 2. In the film forming apparatus 100, the controller 60 controls the irradiator 81 to emit P-polarized IR at a plurality of incident angles onto the substrate W, and the detector 82 detects the light transmitted through the substrate W or the light reflected from the substrate W.

Next, the first incident angle and the second incident angle are specified based on spectrum of transmitted light or reflected light measured at a plurality of incident angles, respectively (step S11), and the processing is terminated. For example, the controller 60 obtains a spectrum indicating the absorbance of infrared light for each wavenumber of transmitted light at each incident angle for a plurality of incident angles from the data detected by the detector 82. The controller 60 determines the incident angle at which the interference signal is the smallest from the spectrum of transmitted light or reflected light measured at each of the incident angles. The controller 60 specifies the first incident angle and the second incident angle from a predetermined angle range with reference to the incident angle at which the interference signal is the smallest. For example, the controller 60 specifies the first incident angle and the second incident angle as the incident angle at which the interference signal is the smallest.

Figure 13:
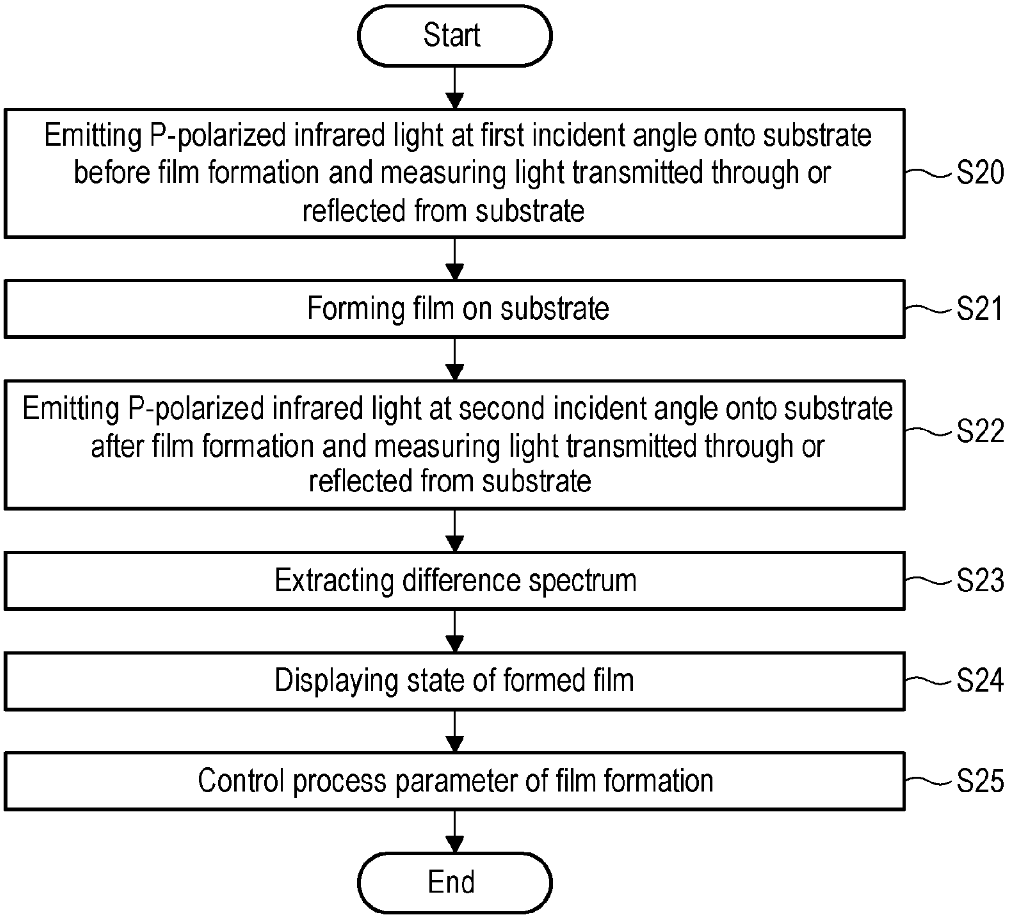
FIG. 13 is a flowchart illustrating an example of the flow of a substrate processing method according to an embodiment.

Next, a flow of a substrate processing method performed by the film forming apparatus 100 according to the embodiment will be described. FIG. 13 is a flowchart illustrating an example of the flow of a substrate processing method according to an embodiment. In the present embodiment, a case where the substrate processing is a film forming process and a film is formed on a substrate by using the substrate processing method will be described as an example.

First, P-polarized infrared light is emitted at a first incident angle onto a substrate on which a pattern 90 including recesses is formed before film formation, and the light transmitted through the substrate or the light reflected from the substrate is measured (step S20). For example, the substrate W having a front surface on which a pattern 90 including recesses 90*a* is formed is placed on the stage 2. In the film forming apparatus 100, the controller 60 controls the irradiator 81 to emit P-polarized infrared light at a first incident angle onto the substrate W before film formation, and the detector 82 detects the light transmitted through the substrate W.

Next, a film is formed on the substrate by using CVD, ALD, or the like (step S21). For example, the controller 60 controls the gas supplier 15 and the RF power supply 10 to form a film 91 on the front surface of the substrate W through plasma ALD.

Next, P-polarized infrared light is emitted at a second incident angle onto the substrate after film formation, and the light transmitted through the substrate or the light reflected from the substrate is measured (step S22). For example, in the film forming apparatus 100, the controller 60 controls the irradiator 81 to emit P-polarized infrared light at the second incident angle onto the substrate W after film formation, and the detector 82 detects the light transmitted through W or the light reflected from the substrate W.

Figure 14:
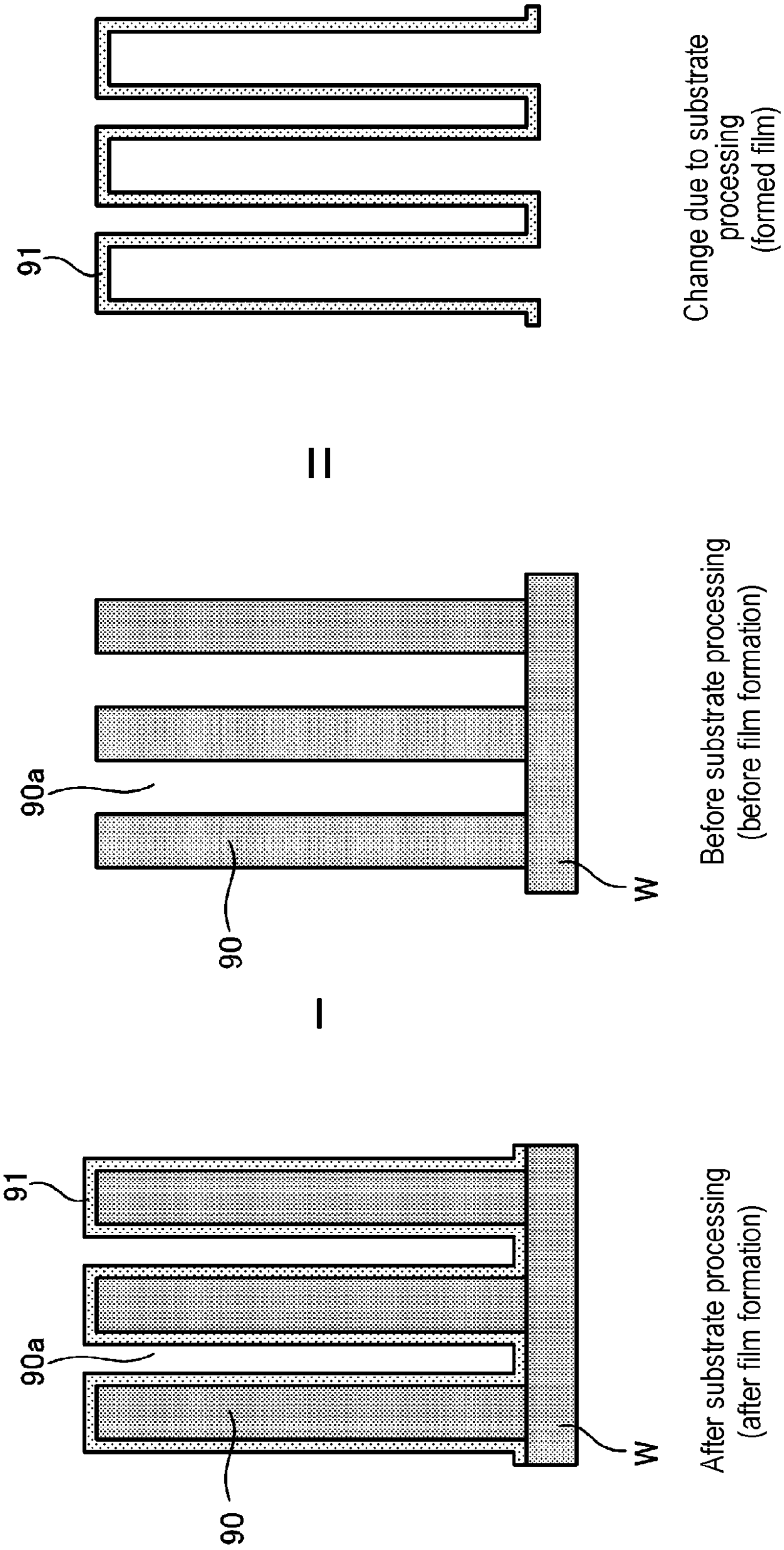
FIG. 14 is a view illustrating difference data according to an embodiment.

Next, the controller extracts a difference spectrum between the spectrum of the light transmitted through the substrate W before the film formation, measured in step S20, and the spectrum of the light transmitted through or reflected from the substrate W after the film formation, measured in step S22 (step S23). For example, the controller 60 determines the spectrum of the light transmitted through or reflected from the substrate W before film formation, from the data detected by the detector 82 in step S20. In addition, the controller 60 determines the spectrum of the light transmitted through or reflected from the substrate W after film formation, from the data detected by the detector 82 in step S22. The controller 60 extracts a difference spectrum between the spectrum of the light transmitted through or reflected from the substrate W before the film formation and the spectrum of the light transmitted through or reflected from the substrate W after the film formation. For example, the controller 60 subtracts the spectrum of infrared light before film formation from the spectrum of infrared light after film formation for each wavenumber, and extracts a difference spectrum indicating the absorbance of infrared light for each wavenumber by the film 91 as difference data. FIG. 14 is a view illustrating difference data according to an embodiment. In FIG. 14, a substrate W on which a pattern 90 including recesses 90*a* is formed is illustrated as a substrate “before film formation”. In addition, a substrate W on which a film 91 is formed on the pattern 90 is illustrated as a substrate “after film formation”. By extracting the difference between the spectrum of transmitted light or reflected light before film formation from the spectrum of transmitted light or reflected light after film formation, a spectrum signal of the film 91 can be extracted as a difference spectrum.

Next, the state of the film formed on the substrate W is displayed based on the extracted difference spectrum (step S24). For example, the controller 60 detects chemical bonds included in the film 91 based on the difference spectrum indicated by the difference data, and displays the detected chemical bonds on the user interface 61.

In addition, process parameters of film formation are controlled based on the extracted difference spectrum (step S25). For example, the controller 60 detects chemical bonds included in the film 91 based on the difference spectrum indicated by the difference data, and controls process parameters depending on the detected chemical bonds.

The processing of the specifying method illustrated in FIG. 12 may be performed separately from the processing of the substrate processing method illustrated in FIG. 13, and may be performed before or after the substrate processing method illustrated in FIG. 13. For example, the processing of the specific method may be performed periodically, such as upon introduction of the film forming apparatus 100 or upon completion of maintenance. As a result, the film forming apparatus 100 may periodically adjust the first incident angle and the second incident angle. In addition, the processing of the specifying method may be performed before the processing of the substrate processing method. This makes it possible for the film forming apparatus 100 to appropriately adjust, for each substrate W on which a film is to be formed, the first incident angle and the second incident angle with respect to the substrate W. In addition, the processing of the specifying method may be performed both before the processing of the substrate processing method and after forming a film on the substrate W (between step S21 and step S22). This makes it possible for the film forming apparatus 100 to appropriately adjust the first incident angle with respect to the substrate W before film formation, and to appropriately adjust the second incident angle with respect to the substrate W after film formation.

Here, an example of specific detection results will be described. As an example, a film 91 was formed on a substrate W having thereon a pattern 90 including recesses 90*a* using the substrate processing method according to the embodiment, with the first incident angle and the second incident angle set to the same angle, and the dependency of the spectrum of the formed film 91 on the incident angle was investigated.

Figure 15A:
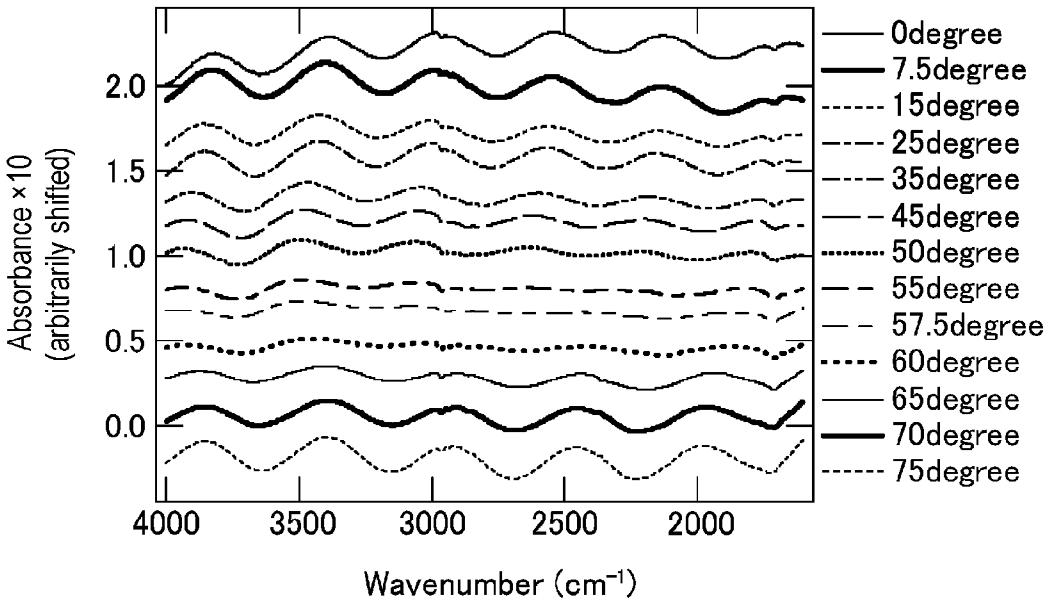
FIG. 15A is a view illustrating an example of spectra of a formed film.
Figure 15B:
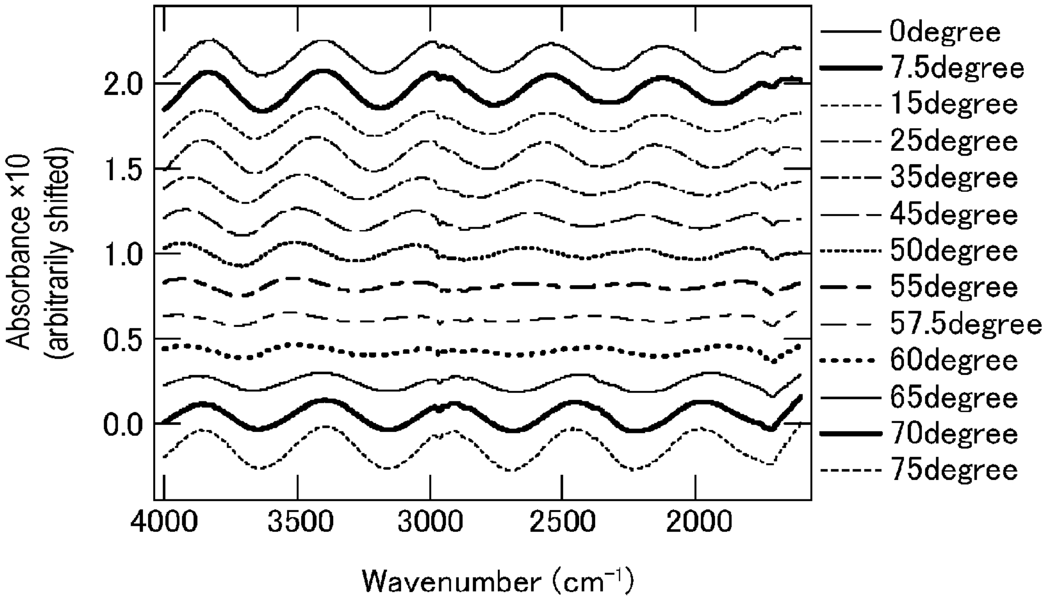
FIG. 15B is a view illustrating an example of the results of extracting interference signals.
Figure 15C:
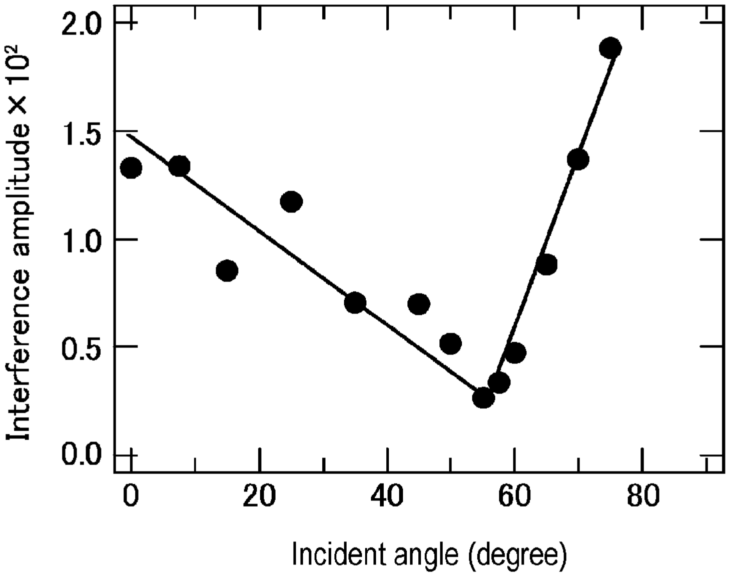
FIG. 15C is a view illustrating an example of the incident angle dependency of interference intensity.

FIG. 15A is a view illustrating an example of spectra of the formed film. The horizontal axis in FIG. 15A represents the wavenumber of infrared light. The vertical axis represents the absorbance of infrared light. FIG. 15A illustrates spectra for each incident angle, in which the spectra are arbitrarily shifted to prevent overlap with each other and incident angles are indicated to respectively correspond to the spectra for each incident angle. FIG. 15A illustrates spectra in a wavenumber range in which the change in signal level due to a substance contained in the film 91 is small. All the spectra undergo periodic changes due to an interference signal. However, the intensity of the interference signal changes depending on the incident angle. For example, by tracing the midpoint of periodic changes and performing baseline processing, it is possible to extract an interference signal and calculate its intensity. FIG. 15B is a view illustrating an example of the results of extracting interference signals. FIG. 15B illustrates interference signals subjected to baseline processing at the midpoint of a periodic signal, in which the interference signals are shifted in the vertical direction as in FIG. 15A and incident angles are indicated to respectively correspond to the interference signals for each incident angle. FIG. 15C is a view illustrating an example of the incident angle dependency of interference intensity. FIG. 15C illustrates amplitudes calculated from one period of the signals in the range of 1,900 to 2,600 $cm^{-1}$ for data subjected to baseline processing at the midpoint of periodic noise. The interference intensity changes depending on the incident angle, and at 57.5°, which is near the Brewster's angle, the interference signal is reduced to ⅕ compared to the incident angle of 0°. In this way, by measuring the incident angles close to the Brewster's angle, the interference signal is suppressed to a small level, so that the state of the film 91 can be detected with high accuracy.

As described above, when the depth of the recesses 90*a* of the pattern 90 is 700 nm or more, it becomes difficult to distinguish the change in absorbance by the film 91 due to the influence of an interference signal. When the depth of the recesses 90*a* of the pattern 90 is 700 nm or more, the interference signal can be suppressed to a small level by determining a difference spectrum by the substrate processing method of the embodiment. The signal intensity of the interference signal increases as the depth of the recesses 90*a* of the pattern 90 formed on the substrate W approaches the wavelength of the infrared light. In addition, the period of periodic change in the interference signal becomes shorter as the depth of the recesses 90*a* increase. Therefore, as the depth of the recesses 90*a* of the pattern 90 increases, the difference spectrum is preferably determined by the substrate processing method of the embodiment. For example, when the depth of the recesses 90*a* of the pattern 90 is 1,000 nm or more, it becomes difficult to distinguish the change in absorbance by the film 91 due to the influence of an interference signal, and when the depth of the recesses 90*a* of the pattern 90 is 1,500 nm or more, it becomes even more difficult to distinguish the change in absorbance by the film 91 due to the influence of an interference signal. Therefore, when the depth of the recesses 90*a* of the pattern 90 is 700 nm or more, the state of the film 91 can be detected with high accuracy by suppressing the interference signal to a small level by determining a difference spectrum by the substrate processing method of the present embodiment. In particular, when the depth of the recesses 90*a* of the pattern 90 is 1,000 nm or more, more preferably, when the depth of the recesses 90*a* of the pattern 90 is 1,500 nm or more, the state of the film 91 can be detected with high accuracy by suppressing the influence of the interference signal by determining a difference spectrum by the substrate processing method.

On the other hand, when the depth of the recesses 90*a* of the pattern 90 exceeds 2 mm, the period of the interference signal becomes extremely short and is averaged within a range of the resolution of the apparatus to be less noticeable. Therefore, the substrate processing method of the embodiment is preferably applied when the depth of the recesses 90*a* of the pattern 90 is in a range of 700 nm or more and 2 mm or less.

Next, as an example, the first incident angle and the second incident angle were set to 57.5°, which is near the Brewster's angle, a film 91 was formed on a substrate W with a pattern 90 including recesses 90*a* by the substrate processing method according to the embodiment, and a spectrum of the formed film 91 was determined.

In addition, as a comparative example, the first incident angle and the second incident angle were set to 57.5°, which is near the Brewster's angle, a film 96 was formed on a flat silicon substrate 95 under the same film forming conditions as the film 91, and the spectrum of the formed film 96 was determined.

Figure 16:
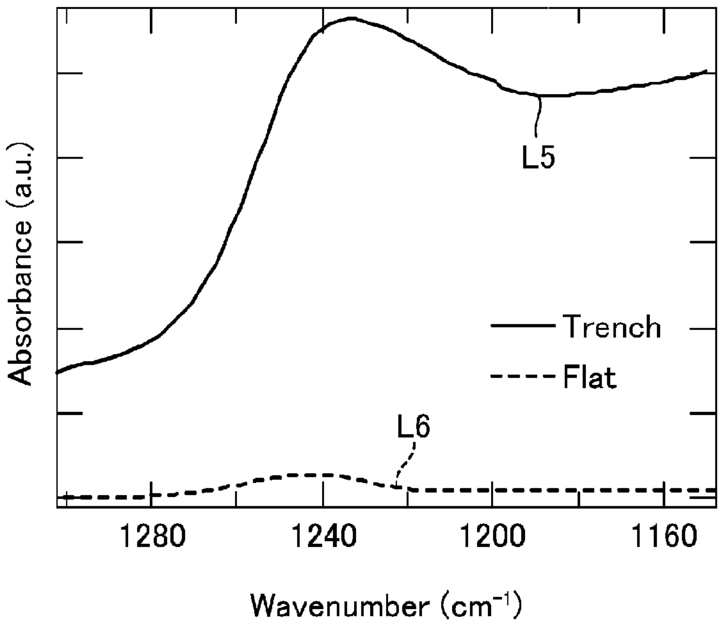
FIG. 16 is a view illustrating an example of spectra of formed films.

FIG. 16 is a view illustrating an example of spectra of formed films. The horizontal axis of FIG. 16 represents the wavenumber of infrared light. The vertical axis represents the absorbance of infrared light. FIG. 16 illustrates a line L5 indicating a spectrum of the film 91 formed on the substrate W with the pattern 90 including recesses 90*a*. In addition, as a comparative example, a line L6 indicating the spectrum of a film 96 formed on the flat silicon substrate 95 is depicted. As illustrated in FIG. 5, in the substrate W with the pattern 90 including the recesses 90*a*, the film 91 is also formed on the side walls and bottoms of the recesses 90*a* of the pattern 90. Therefore, the film 91 formed on the substrate W has a larger volume than the film 96 on the flat silicon substrate 95. Therefore, the line L5 indicating the spectrum of the film 91 formed on the substrate W has higher absorbance than the line L6 indicating the spectrum of the film 96 formed on the flat silicon substrate 95. Since the line L5 is able to detect a weaker signal than the line L6, the line L5 is also able to detect a trace amount of a substance. Infra-red light has a higher wavenumber as the wavelength goes shorter. In addition, the wavenumber of infrared light to be adsorbed varies depending on a substance. Therefore, an FT-IR analysis is able to specify what substances are contained based on the wavenumber of infrared light. In addition, in the FT-IR analysis, the content of a substance can be estimated from the absorbance at each wavenumber. Furthermore, in the FT-IR analysis, the volume (thickness) of a formed film can be estimated from the absorbance at each wavenumber.

In addition, the film 91 formed on the substrate W exhibits a larger volume of the film on the side walls of the recesses 90*a* as the depth of the recesses of the pattern 90 increases. Therefore, as the recesses 90*a* become deeper, the component of the side walls of the recesses 90*a* becomes more dominant in the line L5. That is, as the recesses 90*a* become deeper, the line L5 comes to represent the state of the side walls of the recesses 90*a*.

Figure 17:
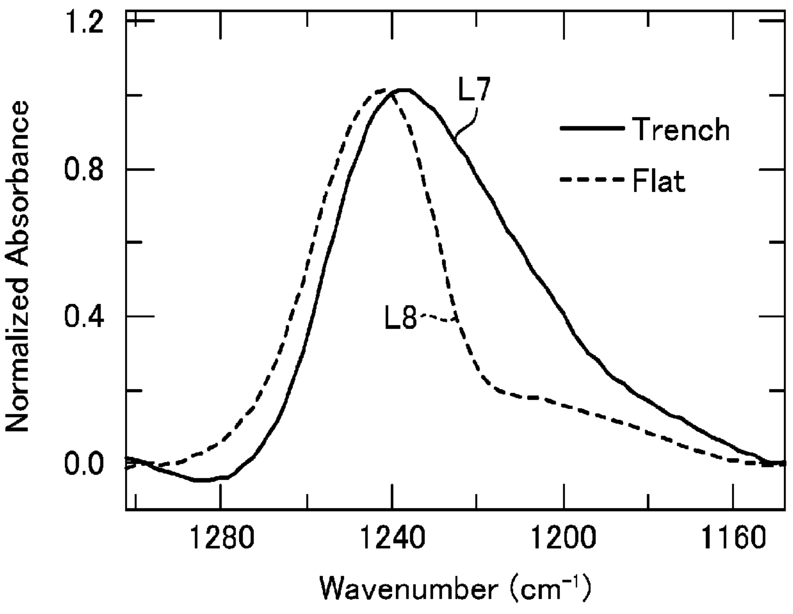
FIG. 17 is a view illustrating an example of spectra of formed films.

FIG. 17 is a view illustrating an example of spectra of formed films. The horizontal axis of FIG. 17 represents the wavenumber of infrared light. The vertical axis represents the absorbance of infrared light normalized by peak intensity. FIG. 17 illustrates a line L7 indicating the spectrum of the film 91 formed on a substrate W with the pattern 90, and a line L8 indicating the spectrum of the film 96 formed on the flat silicon substrate 95 as a comparative example. FIG. 17 illustrates a wavenumber range in which chemical bonds of SiO can be detected. The line L7 and the line L8 have different spectral shapes. From this, the states of formed films 91 and 96 differ between the substrate W with the pattern 90 and the flat silicon substrate 95. For example, as the strength of the bonds of SiO contained in the film increases, the peak wavenumber of the spectrum also increases. In addition, as the structural disorder of SiO contained in the film decreases, the spectral width also decreases. From this, it can be inferred that the film 96 has better film quality than the film 91, and that the film 91 is in a relatively more disordered state in structure.

The controller 60 displays the state of the film 91 formed on the substrate W based on a difference spectrum. For example, the controller 60 displays the spectrum of the formed film 91 on the user interface 61. In addition, from the absorbance at a wavenumber position of absorbed infrared light for each substance and chemical bond in the spectrum of the formed film 91, the controller 60 specifies substances and chemical bonds contained in the film 91 and displays the specified substances and chemical bonds on the user interface 61. The controller 60 may estimate the thickness of the formed film 91 from the absorbance for each wavenumber and may display the estimated film thickness on the user interface 61.

Furthermore, the controller 60 detects the state of the formed film 91 based on the difference spectrum, and controls process parameters depending on the detected state of the film 91. For example, when the film 91 is insufficiently oxidized or nitrided, the controller 60 controls the process parameters for film formation to promote reaction. As a result, the film forming apparatus 100 is capable of improving the quality of the film 91 formed on the pattern 90 in the subsequent film formation.

In the present embodiment, the case where an FT-IR analysis is performed before and after the formation of the film 91 has been described as an example, but the present disclosure is not limited thereto. The film forming apparatus 100 may perform an FT-IR analysis to measure transmitted light or reflected light before and after a specific process during film formation, and extract a difference spectrum in the specific process. For example, it is assumed that the film forming apparatus 100 forms a film 91 by plasma ALD. In the plasma ALD, various processes such as a precursor adsorption process, a modification process, a reaction process, and an exhaust process are sequentially performed. The film forming apparatus 100 may perform an FT-IR analysis to measure transmitted light or reflected light before and after a specific process of the plasma ALD, and extract a difference spectrum in the specific process. This makes it possible for the film forming apparatus 100 to detect the state of the specific process of the plasma ALD. In addition, when various processes such as a precursor adsorption process, a modification process, a reaction process, and an exhaust process are repeated multiple times in the plasma ALD, a measurement may be performed after repeating a predetermined number of times. This makes it possible for the film forming apparatus 100 to detect the state of the film 91 after various processes of the plasma ALD are repeated a predetermined number of times. In addition, the film forming apparatus 100 may constantly perform an FT-IR analysis during each process, determine a difference spectrum between the spectrum of transmitted light or reflected light before each process and the spectrum of transmitted light or reflected light measured in real time, and monitor the difference spectrum in real time. This makes possible for the film forming apparatus 100 to detect the state of each process of the plasma ALD in real time. The controller 60 controls the process parameters based on the difference spectrum. For example, as a result of detecting the states of adsorption, modification, and reaction from the difference spectrum in the adsorption process, the modification process, and the reaction process, when it is determined that the adsorption, the modification, or the reaction is insufficient, the controller 60 controls the process parameters to perform the insufficient process. This makes it possible to suppress insufficient adsorption, insufficient modification, and insufficient reaction, and to improve the quality of the film 91 to be formed. In addition, when processing is taking an unnecessarily long period of time, the process time can be shortened to increase productivity. For example, the film forming apparatus 100 may perform an FT-IR analysis to measure transmitted light or reflected light before or after each process of the plasma ALD, and acquire a difference spectrum of each process by extracting the difference spectrum from the spectrum of the previous process in each process. This makes it possible for the film forming apparatus 100 to detect the state of each process in real time from the difference spectrum of each process.

As described above, the substrate processing method according to the embodiment includes a first measuring process (step S20), a substrate processing process (step S21), a second measuring process (step S22), and an extraction process (step S23). In the first measuring process, P-polarized infrared light is emitted at a first incident angle onto a substrate W on which a pattern 90 including recesses 90*a* is formed, and light transmitted through or reflected from the substrate W is measured. In the substrate processing process, substrate processing is performed on the substrate W after the first measuring process. For example, in the substrate processing process, a film 91 is formed on the substrate W. In the second measuring process, after the substrate processing process, P-polarized infrared light is emitted at a second incident angle onto the substrate W subjected to the substrate processing, and light transmitted through or reflected from the substrate W is measured. For example, in the second measuring process, P-polarized infrared light is emitted at a second incident angle onto the substrate W on which the film 91 is formed, and transmitted light or reflected light is measured. In the extraction process, a difference spectrum between a spectrum indicating the absorbance of infrared light for each wavenumber of the transmitted light or reflected light measured in the first measuring process and a spectrum indicating the absorbance of infrared light for each wavenumber of the transmitted light or reflected light measured in the second measuring process is extracted. The first incident angle and the second incident angle are incident angles at which an interference signal becomes smaller than a change caused by light absorption by the substrate W, in a spectrum of transmitted light or reflected light obtained when emitted P-polarized infrared light is transmitted through or reflected from the substrate W. As a result, in the substrate processing method according to the embodiment, the state of a sample due to substrate processing can be detected from the extracted difference spectrum. For example, in the substrate processing method according to the embodiment, the state of the film 91 formed on the substrate W can be detected from the extracted difference spectrum.

In addition, the substrate processing method according to the embodiment further includes a specifying process (step S11). In the specifying process, the first incident angle and the second incident angle depending on the substrate W are specified. In the first measuring process, P-polarized infrared light is emitted at the first incident angle specified in the specifying process on to the substrate W, and the light transmitted through or reflected from the substrate W is measured. In the second measuring process, after the substrate processing process, P-polarized infrared light is emitted onto the substrate W at the second incident angle specified in the specifying process, and the light transmitted or reflected from the substrate W is measured. As a result, the substrate processing method according to the embodiment is able to perform measurements by specifying the first incident angle and the second incident angle depending on the substrate W, allowing the state of the sample due to substrate processing to be detected while suppressing the influence of interference signals. For example, the substrate processing method according to the embodiment is able to detect the state of the film 91 formed on the substrate W while suppressing the influence of interference signals.

In addition, the substrate processing method according to the embodiment further includes an adjustmental measuring process (step S10). In the adjustmental measuring process, P-polarized infrared light is emitted onto the substrate W at a plurality of incident angles, and the light transmitted through or reflected from the substrate W is measured at each of the incident angles. In the specifying process, the first incident angle and the second incident angle are specified based on the spectrum of transmitted light or reflected light measured at each of the incident angles by the adjustmental measuring process. As a result, in the substrate processing method according to the embodiment, based on the results of measuring the light transmitted through or reflected from the substrate W at each of the incident angles, it is possible to specify the first incident angle and the second incident angle at which an interference signal on the substrate W becomes smaller than a change due to light absorption on the substrate W.

In addition, in the specifying process, from the spectrum of transmitted light or reflected light measured at each of the incident angles in the adjustmental measuring process, the incident angle at which the interference signal is the smallest is determined, and the first incident angle and the second incident angle are specified from a predetermined angle range with reference to the determined incident angle. As a result, in the substrate processing method according to the embodiment, it is possible to specify the first incident angle and the second incident angle at which an interference signal at a substrate W decreases.

In addition, in the specifying process, the Brewster's angle is calculated through arithmetic operation from the refractive indices of the portion of the pattern (the portion of the trench 92) formed on the substrate W and the base layer (base film 93) of the portion of the pattern, and the first incident angle and the second incident angle are specified from a predetermined angle range with reference to the calculated Brewster's angle. As a result, in the substrate processing method according to the embodiment, even without performing the adjustmental measuring process, it is possible to specify, through arithmetic operation, the first incident angle and the second incident angle corresponding to a substrate W at which an interference signal on the substrate W becomes smaller than a change due to light absorption on the substrate W.

In addition, in the specifying process, the first incident angle and the second incident angle are specified as the same angle. In this way, by setting the first incident angle and the second incident angle to be the same angle, similar signals are generated by the substrate W in the spectrum of transmitted light or reflected light in the first measuring process and the spectrum of light in the second measuring process. In the substrate processing method according to the embodiment, by determining the difference spectrum between the spectrum of the transmitted light or reflected light in the first measuring process and the spectrum of the transmitted light or reflected light in the second measuring process, it is possible to remove signals from the substrate W and to detect the state of the film formed on the substrate W.

In addition, in the adjustmental measuring process, P-polarized infrared light is emitted to the substrate W before substrate processing and the substrate W after substrate processing from a plurality of incident angles, and the light transmitted through or reflected from the substrate W is measured at the plurality of incident angles. In the specifying process, from the spectrum of transmitted light or reflected light measured at each of the incident angles on the substrate W before substrate processing and the substrate W after substrate processing, the incident angle at which the interference signal becomes the smallest is determined for each of the substrate W before substrate processing and the substrate W after substrate processing. In the specifying process, the first incident angle and the second incident angle are specified from the incident angle at which the interference signal is the smallest on the substrate W before substrate processing and the incident angle at which the interference signal is the smallest on the substrate W after substrate processing. For example, in the adjustmental measuring process, P-polarized infrared light is emitted from a plurality of incident angles onto the substrate W before a film 91 ("substrate W before film formation") is formed and the substrate W after a film 91 ("substrate W after film formation") is formed, transmitted or reflected light is measured at the incident angles. In the specifying process, from the spectrum of light measured at each of the incident angles on the substrate W before film formation and the substrate W after film formation, the incident angle at which the interference signal becomes the smallest is determined for each of the substrate W before film formation and the substrate W after film formation. In the specifying process, the first incident angle and the second incident angle are specified from the incident angle at which the interference signal is the smallest on the substrate W before film formation and the incident angle at which the interference signal is the smallest on the substrate W after film formation. As a result, in the substrate processing method according to the embodiment, it is possible to specify the first incident angle and the second incident angle at which the interference signal on the substrate W decreases in each of the first measuring process and the second measuring process.

In addition, in the specifying process, the first incident angle is specified from a predetermined angle range with reference to the incident angle at which the interference signal is the smallest on the substrate W before the substrate processing, and the second incident angle is specified from a predetermined angle range with reference to the incident angle at which the interference signal is the smallest on the substrate W after the substrate processing. For example, in the specifying process, the first incident angle is specified from a predetermined angle range with reference to the incident angle at which the interference signal is the smallest on the substrate W before the film formation, and the second incident angle is specified from a predetermined angle range with reference to the incident angle at which the interference signal is the smallest on the substrate W after the film formation. As a result, in the substrate processing method according to the embodiment, the first incident angle at which the interference signal becomes smaller in the first measuring process can be specified in accordance with the substrate W before the substrate processing, and the second incident angle at which the interference signal becomes smaller can be specified in the second measuring process in accordance with the substrate W after the substrate processing. For example, in the substrate processing method according to the embodiment, the first incident angle at which the interference signal becomes smaller in the first measuring process can be specified in accordance with the substrate W before film formation, and the second incident angle at which the interference signal becomes smaller can be specified in the second measuring process in accordance with the substrate W after film formation.

In addition, in the specifying process, the first incident angle and the second incident angle are specified as the same angle from a predetermined angle range with reference to the intermediate angle between the incident angle at which the interference signal is the smallest on the substrate W before substrate processing and the incident angle at which the interference signal is the smallest on the substrate W after substrate processing. For example, in the specifying process, the first incident angle and the second incident angle are specified as the same angle from a predetermined angle range with reference to the intermediate angle between the incident angle at which the interference signal is the smallest on the substrate W before the film formation and the incident angle at which the interference signal is the smallest on the substrate W after the film formation. As a result, in the substrate processing method according to the embodiment, it is possible to specify the first incident angle and the second incident angle at which the interference signal becomes small in each of the first measuring process and the second measuring process. In addition, by setting the first incident angle and the second incident angle to be the same angle, similar signals are generated by the substrate W in the spectrum of light in the first measuring process and the spectrum of light in the second measuring process. In the substrate processing method according to the embodiment, by determining the difference spectrum between the spectrum of light in the first measuring process and the spectrum of light in the second measuring process, it is possible to remove signals from the substrate and to extract a spectrum of the formed film.

In addition, in the substrate W, the depth of the recesses 90*a* of the pattern 90 is 700 nm or more. In this substrate W, a large interference signal is superimposed on the infrared light transmitted through or reflected from the substrate W, but in the substrate processing method according to the embodiment, the state of a sample due to substrate processing can be detected with reduced interference strength. For example, in the substrate processing method according to the embodiment, the state of the film 91 formed on the substrate W can be detected.

In addition, in the extraction process, a difference spectrum indicating the absorbance of infrared light for each wavenumber is extracted by subtracting the spectrum of the transmitted light or reflected light measured in the first measuring process from the spectrum of the transmitted light or reflected light measured in the second measuring process. As a result, in the substrate processing method according to the embodiment, the state of a sample due to substrate processing can be detected from the extracted difference spectrum. For example, in the substrate processing method according to the embodiment, the state of the film 91 formed on the substrate W can be detected from the difference spectrum.

In addition, the substrate processing method according to the embodiment further includes a display process (step S24). In the display process, the state of the film formed on the substrate W in the substrate processing process is displayed based on the difference spectrum extracted in the extraction process. As a result, in the substrate processing method according to the embodiment, the state of a sample due to substrate processing can be presented. For example, with the film forming method according to the embodiment, the state of the film actually formed on the substrate W can be presented to a process manager.

In addition, the substrate processing method according to the embodiment further includes a control process (step S25). In the control process, process parameters of the substrate processing process are controlled based on the difference spectrum extracted in the extraction process. As a result, in the substrate processing method according to the embodiment, the process parameters can be adjusted depending on the state of a sample due to substrate processing, and the state of the sample can be improved in subsequent substrate processing. For example, in the substrate processing method according to the embodiment, the process parameters can be adjusted depending on the state of the film actually formed on the substrate W, and the quality of the film 91 formed on the substrate W in the subsequent film formation can be improved.

Although the embodiments have been described above, it should be considered that the embodiments disclosed herein are exemplary in all respect and are not restrictive. Indeed, the above-described embodiments can be implemented in various forms. In addition, various types of omissions, substitutions, and changes can be made in the above-described embodiments without departing from the scope and spirit of the claims.

Figure 18:
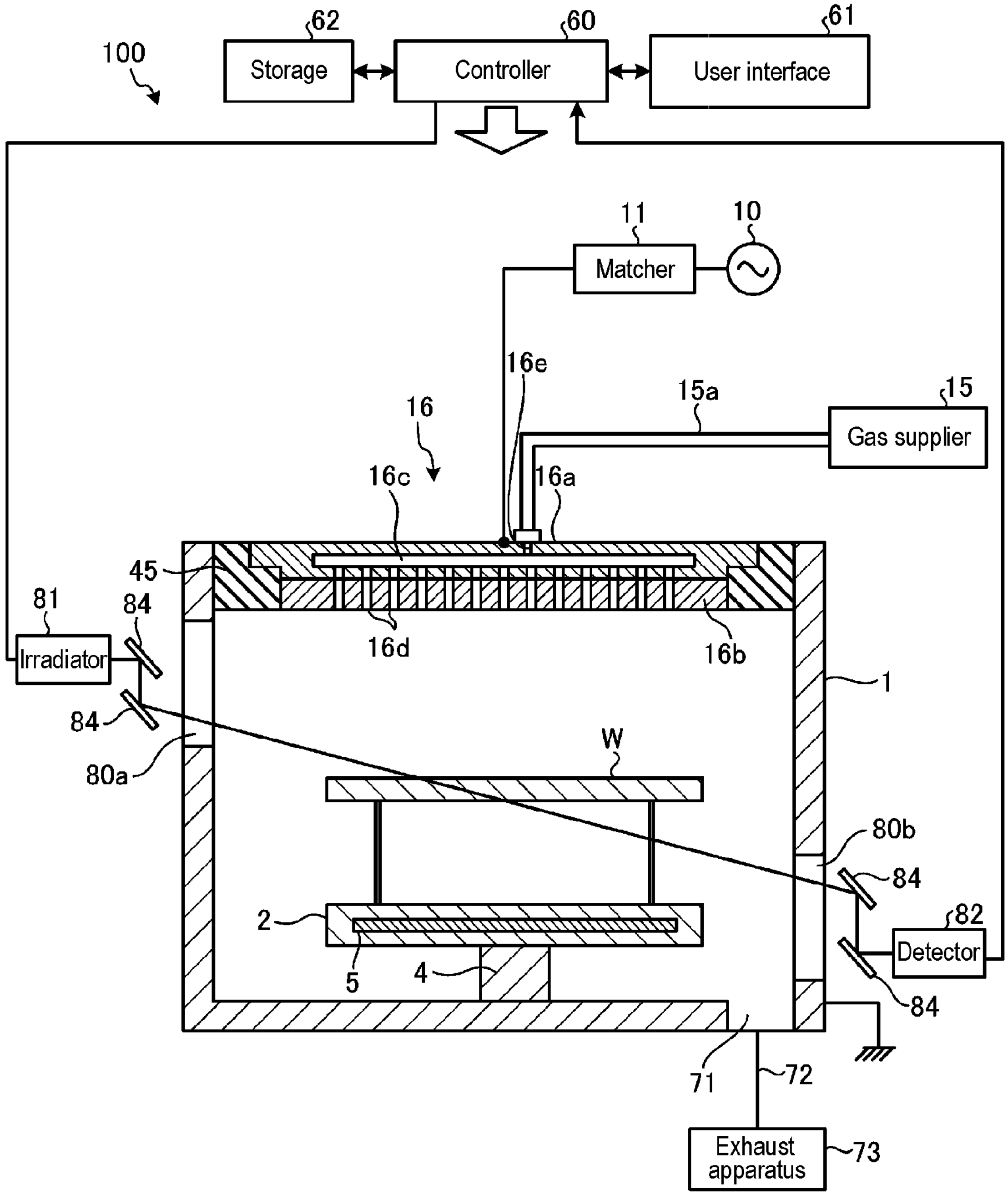
FIG. 18 is a schematical cross-sectional view illustrating another example of the film forming apparatus according to the embodiment.

For example, in the above-described embodiments, the case where the irradiator 81 is configured to be movable vertically and rotatable so that the incident angle of P-polarized infrared light incident on a substrate W can be changed has been described, but the present disclosure is not limited thereto. For example, optical elements such as a mirror and a lens may be provided in the optical path of infrared light emitted from the irradiator 81 or the optical path of infrared light incident on the detector 82, and the incident angle of the P-polarized infrared light incident on the substrate W may be changed by the optical elements. FIG. 18 is a schematical cross-sectional view illustrating another example of the film forming apparatus 100 according to the embodiment. In the film forming apparatus 100 illustrated in FIG. 18, a mirror 84 is provided on the optical path of infrared light emitted from the irradiator 81 and the optical path of infrared light incident on the detector 82. The mirror 84 is configured to be movable and rotatable by a drive mechanism (not illustrated). The film forming apparatus 100 may be configured to be able to change the incident angle of P-polarized infrared light incident on the substrate W by changing the position and angle of the mirror 84.

In addition, in the above-described embodiment, the case where infrared light is transmitted through a substrate W in the vicinity of the center of the substrate W to detect the state of a film in the vicinity of the center of the substrate W has been described, but the present disclosure is not limited thereto. For example, optical elements, such as a mirror that reflects infrared light and a lens, may be provided in the chamber 1, infrared light may be emitted to multiple locations, such as the vicinity of the center and the vicinity of the periphery of a substrate W, by the optical elements, the infrared light transmitted through or reflected from each of the locations may be detected at each of the locations, and the state of the substrate W subjected to substrate processing may be detected at each of the locations on the substrate W. For example, before and after film formation, an FT-IR analysis is performed at a plurality of in-plane locations of a substrate W to acquire detected spectra of light. For each of the locations, the controller 60 extracts the difference spectrum between the spectrum of light detected on the substrate W before film formation and the spectrum of light detected on the substrate W after film formation. The controller 60 controls the process parameters of the substrate processing process based on the extracted difference spectra at the multiple locations. For example, when there is insufficient reaction in the film 91 at any location, the controller 60 controls the process parameters for film formation to promote the reaction. Based on the difference spectra at the multiple locations, the controller 60 may estimate the film thickness at the locations on the substrate W and detect a film thickness distribution. Further, the controller 60 may control the process parameters so that the film has a predetermined quality while making the film thickness distribution uniform. For example, when the film thickness distribution of the film 91 is non-uniform and there is insufficient reaction in the film 91 at any location, the controller 60 controls the process parameters of film formation to promote the reaction so as to make the film 91 uniform.

In addition, in the above-described embodiment, the case where the process parameters of the substrate processing process are controlled from the difference spectrum of one substrate W has been described as an example, but the present disclosure is not limited thereto. From the difference spectra of a plurality of substrates W, the process parameters in the film forming process may be controlled based on the comparison of difference spectra between the substrates W. For example, in the film forming apparatus 100, when film formation is performed on a plurality of substrates W, the states of films to be formed may change due to changes over time or the like. Based on the comparison of the difference spectrum between substrates W, the controller 60 changes the process parameters of the film processing process to suppress the changes in the states of films. For example, when the reaction of a film 91 is insufficient, the controller 60 controls the process parameters of film formation to promote nitriding. As a result, changes in the states of films formed on the plurality of substrates W can be suppressed.

In addition, in the above-described embodiment, the case where the process parameters of the substrate processing process are controlled from the difference spectrum of one substrate W has been described as an example, but the present disclosure is not limited thereto. The conditions of the film forming apparatus 100 may change over time, and the states of films to be formed may change even if the films are formed under the same film formation conditions (recipe). Therefore, the film forming apparatus 100 may periodically perform film formation under the same film formation conditions such as every few days or at every predetermined timing, an FT-IR analysis may be performed before and after the film formation, and the conditions of the film forming apparatus 100 may be diagnosed based on the result of the FT-IR analysis. For example, the film forming apparatus 100 periodically forms films on substrates W under the same film formation conditions. From difference spectra of a plurality of substrates W on each of which a film was formed under the same film formation conditions, the controller 60 diagnoses the conditions of the film forming apparatus 100 based on the comparison of the difference spectra between the substrates. As a result, changes in the conditions of the film forming apparatus 100 can be detected from changes in the states of films formed under the same film formation conditions.

In the above-described embodiment, the case where the substrate processing apparatus of the present disclosure is a single chamber type film forming apparatus 100 having one chamber has been described as an example, but the present disclosure is not limited thereto. The substrate processing apparatus of the present disclosure may be a multi-chamber type film forming apparatus having multiple chambers.

Figure 19:
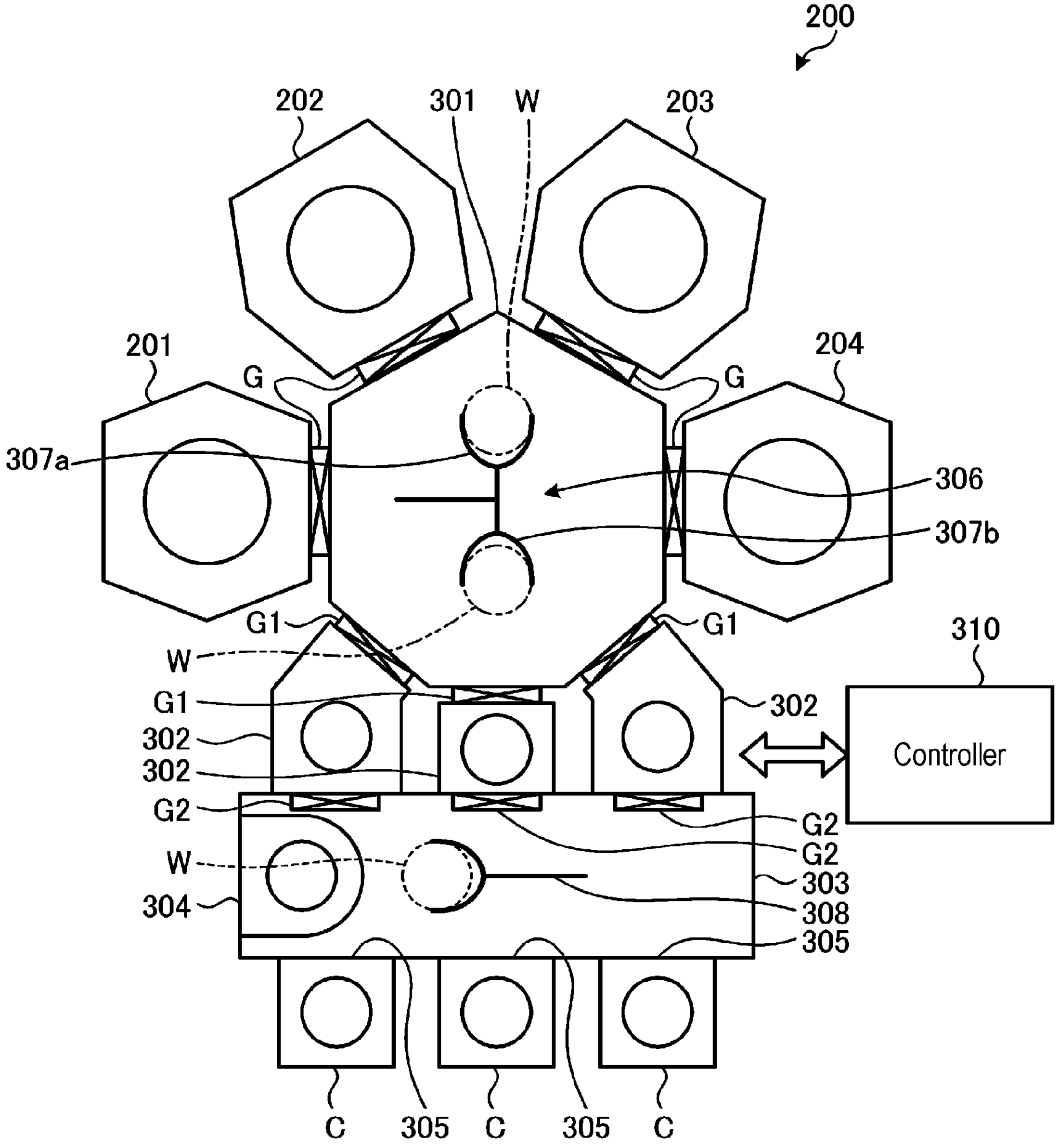
FIG. 19 is a schematical configuration view illustrating another example of the film forming apparatus according to the embodiment.

FIG. 19 is a view schematically illustrating another example of the configuration of the film forming apparatus 200 according to the embodiment. As illustrated in FIG. 19, the film forming apparatus 200 is a multi-chamber type film forming apparatus having four chambers 201 to 204. In the film forming apparatus 200, plasma ALD is performed in each of the four chambers 201 to 204.

The chambers 201 to 204 are connected to four walls of a vacuum transfer chamber 301 having a heptagonal shape in a plan view via gate valves G, respectively. The interior of the vacuum transfer chamber 301 is exhausted by a vacuum pump to be maintained at a predetermined degree of vacuum. Three load-lock chambers 302 are connected to the other three walls of the vacuum transfer chamber 301 via gate valves G1. An atmospheric transfer chamber 303 is provided on the side opposite to the vacuum transfer chamber 301, with the load-lock chambers 302 interposed therebetween. The three load-lock chambers 302 are connected to the atmospheric transfer chamber 303 via gate valves G2, respectively. The load-lock chambers 302 perform pressure control between atmospheric pressure and vacuum when a substrates W are transferred between the atmospheric transfer chamber 303 and the vacuum transfer chamber 301.

The wall opposite to the wall of the atmospheric transfer chamber 303, on which the load-lock chambers 302 are installed, is provided with three carrier installation ports 305 in each of which a carrier (a FOUP or the like) C for accommodating substrates W is installed. In addition, on a side wall of the atmospheric transfer chamber 303, an alignment chamber 304 is provided to perform alignment of substrates W. A downflow of clean air is formed in the atmospheric transfer chamber 303.

In the vacuum transfer chamber 301, a transfer mechanism 306 is provided. The transfer mechanism 306 transfers substrates W to the chambers 201 to 204 and the load-lock chambers 302. The transfer mechanism 306 has two independently movable transfer arms 307*a* and 307*b*.

In the atmospheric transfer chamber 303, a transfer mechanism 308 is provided. The transfer mechanism 308 is configured to transfer substrates W to the carriers C, the load-lock chambers 302, and the alignment chamber 304.

The film forming apparatus 200 has a controller 310. The operation of the film forming apparatus 200 is totally controlled by the controller 310.

In the film forming apparatus 200 configured as described above, a measurement part configured to measure substrates W by infrared spectroscopy may be provided in addition to the chambers 201 to 204. For example, the film forming apparatus 200 includes a measurement part configured to measures substrates W by infrared spectroscopy in one of the vacuum transfer chamber 301, the load-lock chambers 302, the atmospheric transfer chamber 303, and the alignment chamber 304. The measurement part includes an irradiator that emits P-polarized infrared light and a detector that detects infrared light. The irradiator may be positioned and arranged such that emitted P-polarized infrared light is incident on a predetermined region of a substrate W at a first incident angle and a second incident angle. The first incident angle and the second incident angle are set to incident angles within a predetermined angle range with reference to the Brewster's angle of emitted P-polarized infrared light with respect to a substrate W. The first incident angle and the second incident angle may be set to the same incident angle. The detector may be positioned and arranged such that light transmitted through or reflected from a predetermined region of the substrate W enters the detector. In addition, the irradiator may be configured to be able to change the incident angle of P-polarized infrared light incident on a substrate W. For example, the irradiator may be configured to be movable vertically and rotatable and to change the incident angle of P-polarized infrared light incident on a substrate W.

When performing an FT-IR analysis, a substrate W is disposed on the measurement part by the transfer mechanism 306 in the film forming apparatus 200. The measurement part emits P-polarized infrared light from the irradiator at a first incident angle onto the wafer W and detects light transmitted through or reflected from the substrate W by the detector.

The controller 310 measures a substrate W before film formation by the measurement part. The controller 310 forms a film on the substrate W by one of the chambers 201 to 204. The controller 310 measures the substrate W after film formation by the measurement part. The measurement part emits P-polarized infrared light from the irradiator at a second incident angle onto the substrate W and detects light transmitted through or reflected from the substrate W by the detector.

The controller 310 extracts a difference spectrum between the spectrum of the light transmitted through or reflected from the substrate W before the film formation and the spectrum of the light transmitted through or reflected from the substrate W after the film formation. As a result, even in the film forming apparatus 200, it is possible to detect the state of a film formed on a substrate W on which a pattern 90 including the recesses 90*a* is formed.

In addition, in the above-described embodiment, an example in which the substrate processing process is a film forming process of forming a film on a substrate W and the state of the film formed on the substrate W is detected as the state of the substrate W due to substrate processing by applying the technique of the present disclosure has been described, but the present disclosure is not limited thereto. The substrate processing process for detecting the state of a substrate W may be, for example, any process related to a semiconductor manufacturing process, such as a film forming process, an etching process, a modification process, a resist coating process, a cleaning process, a lithography process, a chemical mechanical polishing process, or an inspection process, and may be multiple processes including a combination thereof. In addition, from the viewpoint of any process related to a semiconductor manufacturing process and/or multiple processes including a combination thereof, the technique of the present disclosure may be applied for in-process or inter-process diagnosis or monitoring by applying the technique of the present disclosure before and after any process or multiple processes. For example, the technique of the present disclosure may be applied to various triggers (particles, in-plane/inter-plane distribution, or the like) related to semiconductor manufacturing productivity (operation rate, yield, or the like).

Figure 20:
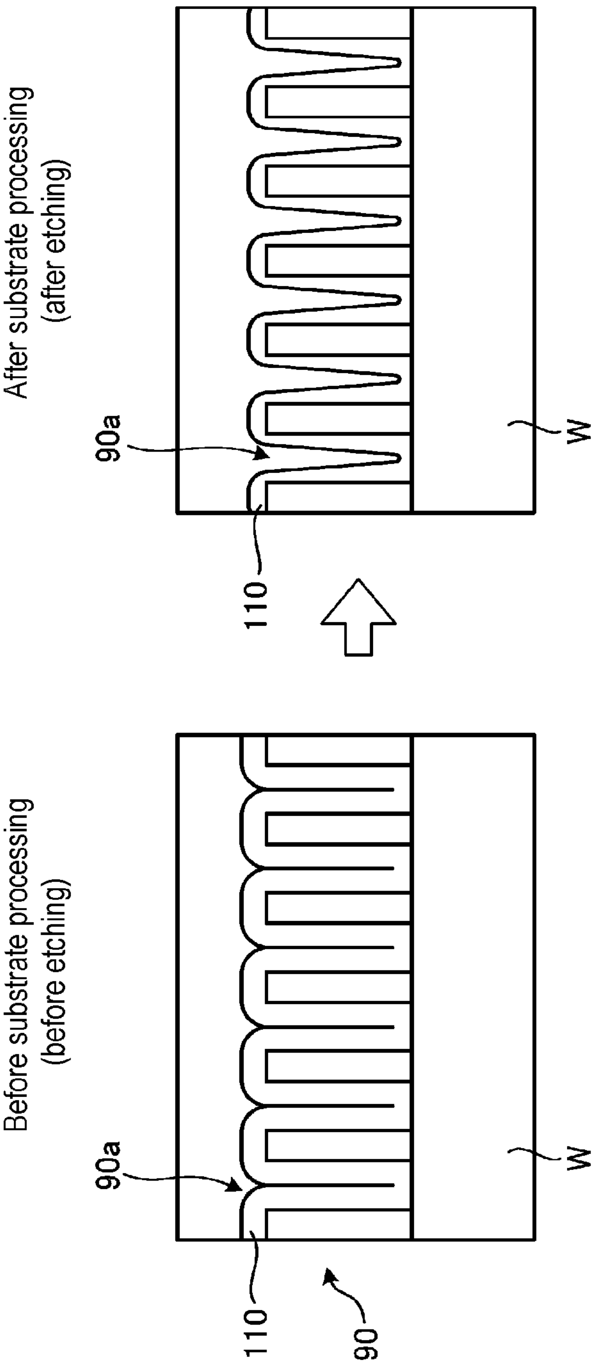
FIG. 20 is a view illustrating an example of a substrate processing process according to an embodiment.
Figure 21:
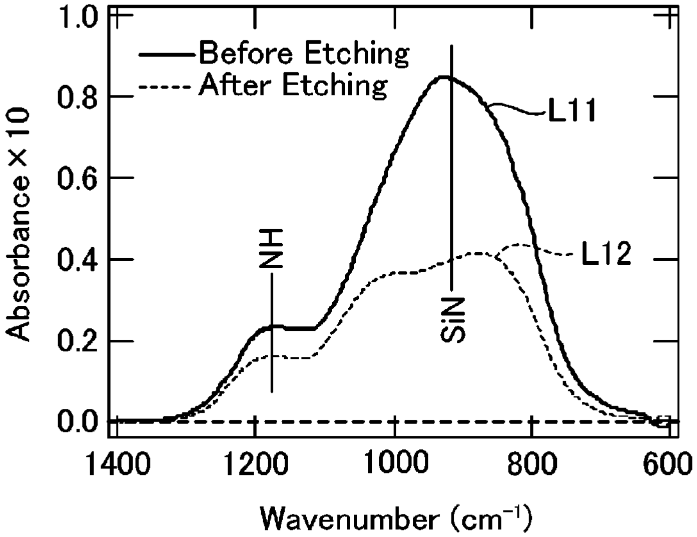
FIG. 21 is a view illustrating an example of spectra.
Figure 22:
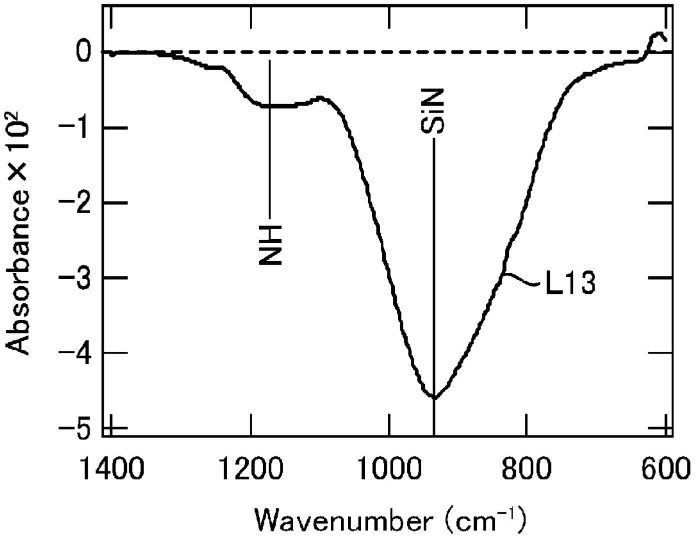
FIG. 22 is a view illustrating an example of a difference spectrum.

Here, an example in which the substrate processing process is other than a film forming process will be described. FIG. 20 is a view illustrating an example of a substrate processing process according to an embodiment. FIG. 20 illustrates the case where the substrate processing process is a dry etching process. In FIG. 20, a substrate W before dry etching is illustrate on the left, and the substrate W after dry etching is illustrated on the right. A pattern 90 including a nanoscale recess 90*a* is formed on the substrate W. A SiN film 110 is formed on the pattern 90. FIG. 20 illustrates the case where the substrate W is subjected to dry etching using $NF_3$ gas. The substrate processing apparatus is an etching apparatus that performs dry etching. In the substrate processing method according to the present embodiment, P-polarized infrared light is emitted at a first incident angle onto the substrate W, and light transmitted through or reflected from the substrate W is measured. In the substrate processing method, after the measurement, dry etching is performed on the substrate W as the substrate processing. In the substrate processing method, after dry etching, P-polarized infrared light is emitted at a second incident angle onto the dry-etched substrate W, and the light transmitted through or reflected from the substrate W is measured. In the substrate processing method, a difference spectrum between the measured spectrum of transmitted light or reflected light before the dry etching and the spectrum of transmitted light or reflected light after the dry etching is extracted. FIG. 21 is a view illustrating an example of spectra. The horizontal axis of FIG. 21 represents the wavenumber of infrared light. The vertical axis represents the absorbance of infrared light. FIG. 21 illustrates a line L11 indicating the spectrum before dry etching and a line L12 indicating the spectrum after dry etching. In addition, FIG. 21 illustrates the positions of wavenumbers corresponding to NH and SiN. The lines L11 and L12 indicating the spectra change before and after dry etching. For example, the spectrum signal in the wavenumber portion corresponding to SiN is changing. FIG. 22 is a view illustrating an example of a difference spectrum. The horizontal axis of FIG. 22 represents the wavenumber of infrared light. The vertical axis represents the absorbance of infrared light. FIG. 22 illustrates a line L13 indicating the difference spectrum between the spectrum before dry etching and the spectrum after dry etching. In addition, FIG. 22 illustrates the positions of wavenumbers corresponding to NH and SiN. In the substrate processing method according to the present embodiment, the state of the substrate W due to substrate processing can be detected from the difference spectrum. For example, in the etching such as dry etching, the signal of the etched component is reduced in the spectrum. Therefore, in the difference spectrum, the signal with the wavenumber corresponding to an etched component has a negative value. Therefore, a component corresponding to the wavenumber where the signal has a negative value can be detected as an etched component. For example, in FIG. 22, since the signal of the line L13 decreases at the positions of SiN and NH, it can be detected that a SiN film 110 containing NH in the film has been etched.

Figure 23:
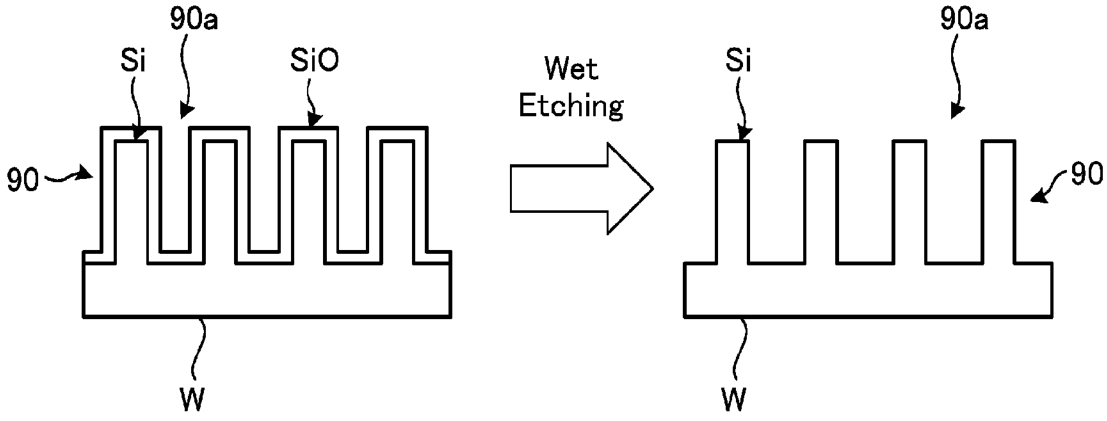
FIG. 23 is a view illustrating an example of a substrate processing process according to an embodiment.
Figure 24:
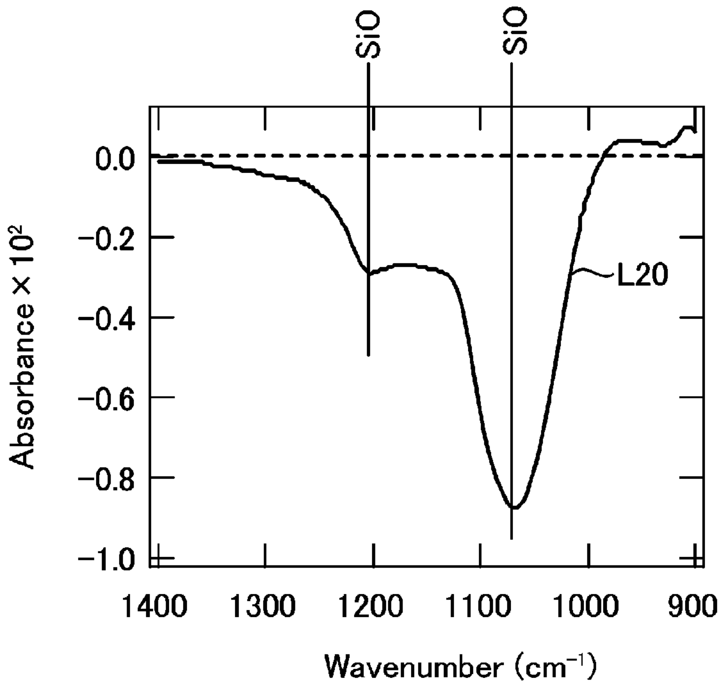
FIG. 24 is a view illustrating an example of a difference spectrum.

FIG. 23 is a view illustrating an example of a substrate processing process according to an embodiment. FIG. 23 illustrates the case where the substrate processing process is a wet etching process. In FIG. 23, a substrate W before wet etching is illustrated on the left, and the substrate W after wet etching is illustrated on the right. A pattern 90 including nanoscale recesses 90*a* is formed on the substrate W. FIG. 23 illustrates a case where a SiO film formed on the pattern 90 is etched by wet etching. The substrate processing apparatus is an etching apparatus that performs wet etching. In the substrate processing method according to the present embodiment, P-polarized infrared light is emitted at a first incident angle onto the substrate W, and light transmitted through or reflected from the substrate W is measured. In the substrate processing method, after the measurement, wet etching is performed on the substrate W as the substrate processing. In the substrate processing method, after the wet etching, P-polarized infrared light is emitted at a second incident angle onto the wet-etched substrate W, and the light transmitted through or reflected from the substrate W is measured. In the substrate processing method, a difference spectrum between the measured spectrum of transmitted light or reflected light before the wet etching and the spectrum of transmitted light or reflected light after the wet etching is extracted. FIG. 24 is a view illustrating an example of a difference spectrum. The horizontal axis of FIG. 24 represents the wavenumber of infrared light. The vertical axis represents the absorbance of infrared light. FIG. 24 illustrates a line L20 indicating a difference spectrum. In addition, FIG. 24 illustrates the positions of wavenumbers corresponding to SiO. In the substrate processing method according to the present embodiment, the state of the substrate W due to substrate processing can be detected from the difference spectrum. For example, in FIG. 24, it can be detected from the line L20 that SiO has been etched.

Figure 25:
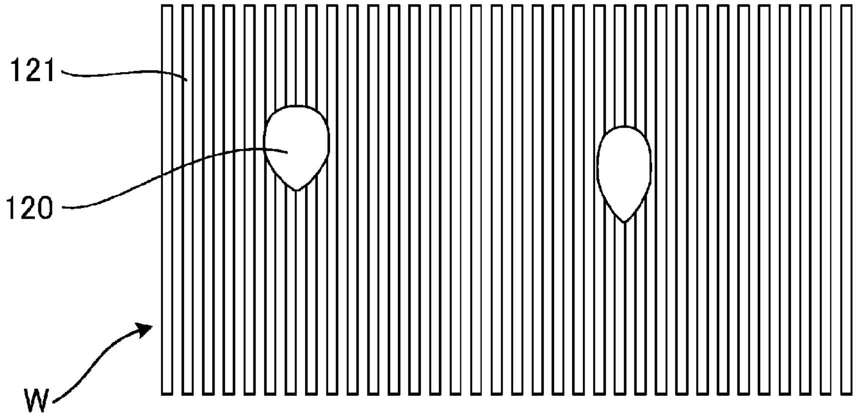
FIG. 25 is a view illustrating an example of the substrate processing process according to an embodiment.
Figure 26:
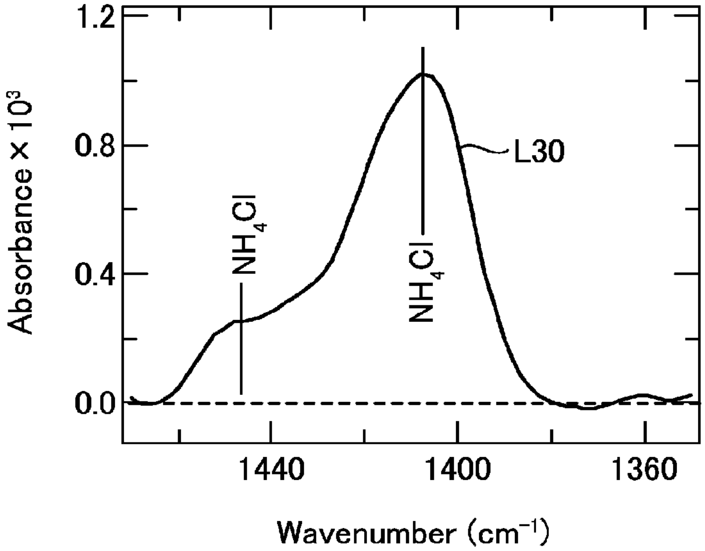
FIG. 26 is a view illustrating an example of a difference spectrum.

FIG. 25 is a view illustrating an example of the substrate processing process according to an embodiment. FIG. 25 illustrates a case where a by-product 120 is attached to the substrate W due to the substrate processing process such as a film forming process or an etching process. A trench 121 is formed in the substrate W as a pattern including recesses. In the substrate processing method according to the present embodiment, P-polarized infrared light is emitted at a first incident angle onto the substrate W, and light transmitted through or reflected from the substrate W is measured. In the substrate processing method, after the measurement, substrate processing is performed on the substrate W. In the substrate processing method, after the substrate processing, P-polarized infrared light is emitted at a second incident angle onto the substrate W subjected to the substrate processing, and the light transmitted through or reflected from the substrate W is measured. In the substrate processing method, a difference spectrum between the measured spectrum of transmitted light or reflected light before the substrate processing and the spectrum of transmitted light or reflected light after the substrate processing is extracted. FIG. 26 is a view illustrating an example of a difference spectrum. The horizontal axis of FIG. 26 represents the wavenumber of infrared light. The vertical axis represents the absorbance of infrared light. FIG. 26 illustrates a line L30 indicating a difference spectrum. In addition, FIG. 26 illustrates the positions of wavenumbers corresponding to $NH_4Cl$. In the substrate processing method according to the present embodiment, the state of the substrate W due to substrate processing can be detected from the difference spectrum. For example, the state of the substrate W can be detected based on whether a change in the signal of an unintended component occurs in a difference spectrum as a result of substrate processing. For example, as illustrated in FIG. 25, when a by-product 120 is attached to the substrate W, in the difference spectrum, changes occur in the signal at the wavenumbers corresponding to the component of the by-product 120. For example, in FIG. 26, a change has occurred in the signal at the wavenumbers corresponding to $NH_4Cl$, which is the component of the by-product 120. From this, with the substrate processing method according to the present embodiment, it is possible to detect that the by-product 120 is attached to the substrate W due to the substrate processing.

Figure 27:
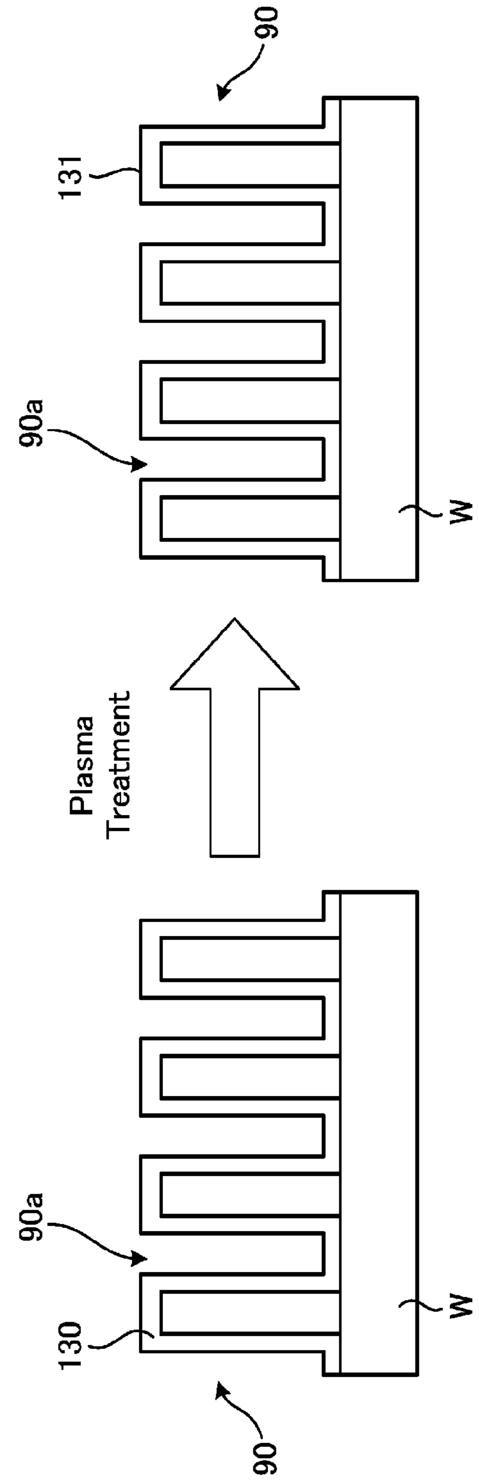
FIG. 27 is a view illustrating an example of a substrate processing process according to an embodiment.
Figure 28:
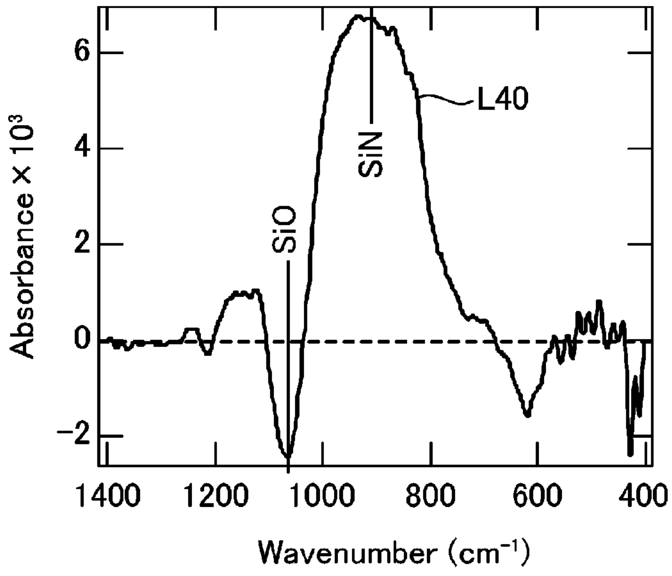
FIG. 28 is a view illustrating an example of a difference spectrum.

FIG. 27 is a view illustrating an example of a substrate processing process according to an embodiment. FIG. 27 illustrates a case where the substrate processing process is a modification process such as plasma treatment. In FIG. 27, a substrate W before plasma treatment is illustrated on the left, and the substrate W after plasma treatment is illustrated on the right. A pattern 90 including a nanoscale recess 90*a* is formed on the substrate W. An SiO film 130 exists on the pattern 90 before plasma treatment. FIG. 27 illustrates a case where the substrate W is subjected to plasma treatment to modify the SiO film 130 into a SiN film 131. The substrate processing apparatus is a plasma processing apparatus that performs plasma treatment. In the substrate processing method according to the present embodiment, P-polarized infrared light is emitted at a first incident angle onto the substrate W, and light transmitted through or reflected from the substrate W is measured. In the substrate processing method, after the measurement, plasma treatment is performed on the substrate W as the substrate processing. In the substrate processing method, after the plasma treatment, P-polarized infrared light is emitted at a second incident angle onto the substrate W subjected to the plasma treatment, and the light transmitted through or reflected from the substrate W is measured. In the substrate processing method, a difference spectrum between the measured spectrum of transmitted light or reflected light before the plasma treatment and the spectrum of transmitted light or reflected light after the plasma treatment is extracted. FIG. 28 is a view illustrating an example of a difference spectrum. The horizontal axis of FIG. 28 represents the wavenumber of infrared light. The vertical axis represents the absorbance of infrared light. FIG. 28 illustrates a line L40 indicating a difference spectrum. In addition, FIG. 28 illustrates the positions of wavenumbers corresponding to SiO and SiN. In the substrate processing method according to the present embodiment, the state of the substrate W due to substrate processing can be detected from the difference spectrum. For example, in FIG. 24, it can be detected from the line L40 that SiO has been modified into SiN.

In addition, as described above, the substrate processing apparatus of the present disclosure has been disclosed as an example of a single chamber type substrate processing apparatus or a multi-chamber type substrate processing apparatus having a plurality of chambers, but the present disclosure is not limited thereto. For example, the substrate processing apparatus may be a batch type substrate processing apparatus capable of process a plurality of substrates at once, or may be a carousel semi-batch type substrate processing apparatus.

It is to be understood that the embodiment disclosed herein are exemplary in all respects and are not restrictive. Indeed, the above-described embodiments can be implemented in various forms. Various types of omissions, replacements, and changes may be made to the above-described embodiments without departing from the scope and spirit of the appended claims.

In addition, regarding the above-described embodiments, the following appendices are disclosed.

(Appendix 1)

A substrate processing method including: a first measuring process of emitting P-polarized infrared light, at a first incident angle, onto a substrate on which a pattern including a recess is formed, and measuring light transmitted through the substrate or light reflected from the substrate; a substrate processing process of performing substrate processing on the substrate after the first measuring process; a second measuring process of emitting, after the substrate processing process, P-polarized infrared light, at a second incident angle, onto the substrate subjected to the substrate processing, and measuring light transmitted through the substrate or light reflected from the substrate; and an extraction process of extracting a difference spectrum between a spectrum indicating the absorbance of infrared light for each wavenumber of the transmitted light or reflected light measured in the first measuring process and a spectrum indicating the absorbance of infrared light for each wavenumber of the transmitted light or reflected light measured in the second measuring process, wherein the first incident angle and the second incident angle are incident angles at which an interference signal becomes smaller than a change caused by light absorption by the substrate in the spectrum of the transmitted light or reflected light obtained when the emitted P-polarized infrared light is transmitted through or reflected from the substrate.

(Appendix 2)

The substrate processing method of Appendix 1, further including a specifying process of specifying the first incident angle and the second incident angle, wherein, in the first measuring process, P-polarized infrared light is emitted onto the substrate at the first incident angle specified in the specifying process, and the light transmitted through or reflected from the substrate is measured, and wherein, in the second measuring process, after the substrate processing process, P-polarized infrared light is emitted onto the substrate at the second incident angle specified in the specifying process, and the light transmitted through or reflected from the substrate is measured.

(Appendix 3)

The substrate processing method of Appendix 2, further including an adjustmental measuring process of emitting P-polarized infrared light at a plurality of incident angles onto the substrate and measuring light transmitted or reflected from the substrate at each of the plurality of incident angles, wherein, in the specifying process, the first incident angle and the second incident angle are specified based on the spectrum of transmitted light or reflected light measured at each of the plurality of incident angles in the adjustmental measuring process.

(Appendix 4)

The substrate processing method of Appendix 3, wherein, in the specifying process, the incident angle at which the interference signal is the smallest is determined from the spectrum of transmitted light or reflected light measured at each of the plurality of incident angles in the adjustmental measuring process, and the first incident angle and the second incident angle are specified from a predetermined angle range with reference to the determined incident angle.

(Appendix 5)

The substrate processing method of Appendix 2, wherein, in the specifying process, a Brewster's angle is calculated through arithmetic operation from refractive indices of the pattern portion formed on the substrate and a base layer of the pattern portion, and the first incident angle and the second incident angle are specified from a predetermined angle range with reference to the calculated Brewster's angle.

(Appendix 6)

The substrate processing apparatus of any one of Appendices 2 to 5, wherein, in the specifying process, the first incident angle and the second incident angle are specified as the same angle.

(Appendix 7)

The substrate processing method of Appendix 3 or 4, wherein, in the adjustmental measuring process, P-polarized infrared light is emitted to the substrate before the substrate processing and the substrate after the substrate processing at a plurality of incident angles, and the light transmitted through or reflected from the substrate is measured at the plurality of incident angles, and wherein, in the specifying process, an incident angle at which an interference signal is the smallest for each of the substrate before the substrate processing and the substrate after the substrate processing is determined from the spectrum of the transmitted light or reflected light measured at each of the plurality of incident angles with respect to the substrate before the substrate processing and the substrate after the substrate processing, and the first incident angle and the second incident angle are specified from the incident angle at which the interference signal is the smallest on the substrate before the substrate processing and the incident angle at which the interference signal is the smallest on the substrate after the substrate processing.

(Appendix 8)

The substrate processing method of Appendix 7, wherein, in the specifying process, the first incident angle is specified from a predetermined angle range with reference to the incident angle at which the interference signal is the smallest on the substrate W before the substrate processing, and the second incident angle is specified from a predetermined angle range with reference to the incident angle at which the interference signal is the smallest on the substrate W after the substrate processing.

(Appendix 9)

The substrate processing method of Appendix 7, wherein, in the specifying process, the first incident angle and the second incident angle are specified as a same angle from a predetermined angle range with reference to an intermediate angle between an incident angle at which the interference signal is the smallest on the substrate before the substrate processing and an incident angle at which the interference signal is the smallest on the substrate after the substrate processing.

(Appendix 10)

The substrate processing method of Appendix 1, wherein the first incident angle and the second incident angle are incident angles within a predetermined angle range with reference to a Brewster's angle of the emitted P-polarized infrared light with respect to the substrate.

(Appendix 11)

The substrate processing method of Appendix 1 or 2, wherein the first incident angle and the second incident angle are set to the same angle.

(Appendix 12)

The substrate processing apparatus of any one of Appendices 1 to 11, wherein the recess of the pattern in the substrate has a depth of 700 nm or more.

(Appendix 13)

The substrate processing apparatus of any one of Appendices 1 to 12, wherein, in the extraction process, the difference spectrum indicating the absorbance of infrared light for each wavenumber is extracted by subtracting the spectrum of the transmitted light or reflected light measured in the first measuring process from the spectrum of the transmitted light or reflected light measured in the second measuring process.

(Appendix 14)

The substrate processing apparatus of any one of Appendices 1 to 13, further including a display process of displaying the state of the substrate subjected to the substrate processing in the substrate processing process based on the difference spectrum extracted in the extraction process.

(Appendix 15)

The substrate processing apparatus of any one of Appendices 1 to 14, further including a control process of controlling a process parameter of the substrate processing process based on the difference spectrum extracted in the extraction process.

(Appendix 16)

The substrate processing method of Appendix 15, wherein, in the control process, the process parameter of the substrate processing process is controlled based on a comparison of inter-substrate difference spectra from the difference spectra of the plurality of substrates.

(Appendix 17)

The substrate processing method of Appendix 15, wherein the first measuring process and the second measuring process are performed at each of multiple in-plane locations of the substrate, and wherein, in the control process, a difference spectrum between the spectrum of the transmitted light or reflected light measured in the first measuring process and the spectrum of the transmitted light or reflected light measured in the second measuring process is extracted at each of the multiple locations, and a process parameter is controlled based on the difference spectra of the multiple locations.

(Appendix 18)

The substrate processing method of Appendix 17, wherein the substrate processing process is a process of forming a film on the substrate, and wherein, in the control process, a film thickness distribution and film quality of the film formed on the substrate are determined from the difference spectra of the multiple locations, and the process parameter is controlled to achieve a predetermined film quality while making the film thickness distribution uniform.

(Appendix 19)

The substrate processing method of Appendix 17, wherein the substrate processing process is a process of etching the substrate, and wherein, in the control process, a volume distribution and composition of the etched film are determined from the difference spectra of the multiple locations, and the process parameter is controlled such that a predetermined film is etched while making an etched amount distribution uniform.

(Appendix 20)

The substrate processing method of any one of Appendices 1 to 19, wherein, the substrate processing process is performed on the substrate periodically under a same processing condition, and wherein the substrate processing method further includes a diagnosis process of diagnosing the condition of an apparatus that performs the substrate processing process based on a comparison of inter-substrate difference spectra from the difference spectra of the plurality of substrates subjected to the substrate processing under the same processing condition.

(Appendix 21)

A substrate processing apparatus including: a stage configured to place thereon a substrate on which a pattern including a recess is formed; a substrate processor configured to perform substrate processing on the substrate; a measurement part configured to perform a measurement by infrared spectroscopy by emitting P-polarized infrared light to the substrate; and a controller configured to execute control to: measure, by the measurement part, light transmitted through or reflected from the substrate by emitting P-polarized infrared light at a first incident angle onto the substrate before the substrate processing; perform, by the substrate processor, the substrate processing on the substrate; measure, by the measurement part, light transmitted through or reflected from the substrate by emitting P-polarized infrared light at a second incident angle onto the substrate after the substrate processing; and extract a difference spectrum between a spectrum indicating absorbance of infrared light for each wavenumber of the measured light transmitted through or reflected from the substrate before the substrate processing and a spectrum indicating absorbance of infrared light for each wavenumber of the measured light transmitted through or reflected from the substrate after the substrate processing, wherein the first incident angle and the second incident angle are incident angles at which an interference signal becomes smaller than a change caused by light absorption by the substrate in the spectrum of the transmitted light or reflected light obtained when the emitted P-polarized infrared light is transmitted through or reflected from the substrate.

EXPLANATION OF REFERENCE NUMERALS

W: substrate, 1: chamber, 2: stage, 6: lifter pin, 10: radio-frequency power, 15; gas supplier, 16: shower head, 60: controller, 61: user interface, 62: memory, 80*a*: window, 80*b*: window, 81: irradiator, 82: detector, 83: polarizer, 84: mirror, 90: pattern, 90*a*: recess, 91: film, 95: silicon substrate, 96: film, 100: film forming apparatus, 200: film forming apparatus, 201 to 204: chamber

What is claimed is:

1. A substrate processing method comprising:

a first measuring process of emitting P-polarized infrared light, at a first incident angle, onto a substrate on which a pattern comprising one or more recesses is formed, and measuring light transmitted through the substrate or light reflected from the substrate;

a substrate processing process of performing substrate processing on the substrate after the first measuring process;

a second measuring process of emitting, after the substrate processing process, P-polarized infrared light, at a second incident angle, onto the substrate subjected to the substrate processing, and measuring light transmitted through the substrate or light reflected from the substrate; and an extraction process of extracting a difference spectrum between a spectrum indicating absorbance of infrared light for each wavenumber of the transmitted light or reflected light measured in the first measuring process and a spectrum indicating absorbance of infrared light for each wavenumber of the transmitted light or reflected light measured in the second measuring process, wherein the first incident angle and the second incident angle are incident angles at which an interference signal becomes smaller than a change caused by light absorption by the substrate in the spectrum of the transmitted light or reflected light obtained when each of the P-polarized infrared lights emitted at the first incident angle and the second incident angle is transmitted through or reflected from the substrate.

2. The substrate processing method of claim 1, further comprising:

a specifying process of specifying the first incident angle and the second incident angle, wherein, in the first measuring process, the P-polarized infrared light is emitted onto the substrate at the first incident angle specified in the specifying process, and the light transmitted through or reflected from the substrate is measured, and wherein, in the second measuring process, after the substrate processing process, the P-polarized infrared light is emitted onto the substrate at the second incident angle specified in the specifying process, and the light transmitted through or reflected from the substrate is measured.

3. The substrate processing method of claim 2, further comprising:

an adjustmental measuring process of emitting P-polarized infrared light at a plurality of incident angles onto the substrate and measuring light transmitted or reflected from the substrate at each of the plurality of incident angles, wherein, in the specifying process, the first incident angle and the second incident angle are specified based on the spectrum of transmitted light or reflected light measured at each of the plurality of incident angles in the adjustmental measuring process.

4. The substrate processing method of claim 3, wherein, in the specifying process, the incident angle at which the interference signal is the smallest is determined from the spectrum of transmitted light or reflected light measured at each of the plurality of incident angles in the adjustmental measuring process, and the first incident angle and the second incident angle are specified from a predetermined angle range with reference to the determined incident angle.

5. The substrate processing method of claim 3, wherein, in the adjustmental measuring process, the P-polarized infrared light is emitted to the substrate before the substrate processing and the substrate after the substrate processing at a plurality of incident angles, and the light transmitted through or reflected from the substrate is measured at the plurality of incident angles, and wherein, in the specifying process, an incident angle at which an interference signal is the smallest for each of the substrate before the substrate processing and the substrate after the substrate processing is determined from the spectrum of the transmitted light or reflected light measured at each of the plurality of incident angles with respect to the substrate before the substrate processing and the substrate after the substrate processing, and the first incident angle and the second incident angle are specified from the incident angle at which the interference signal is the smallest on the substrate before the substrate processing and the incident angle at which the interference signal is the smallest on the substrate after the substrate processing.

6. The substrate processing method of claim 5, wherein, in the specifying process, the first incident angle is specified from a predetermined angle range with reference to the incident angle at which the interference signal is the smallest on the substrate before the substrate processing, and the second incident angle is specified from a predetermined angle range with reference to the incident angle at which the interference signal is the smallest on the substrate after the substrate processing.

7. The substrate processing method of claim 5, wherein, in the specifying process, the first incident angle and the second incident angle are specified as a same angle from a predetermined angle range with reference to an intermediate angle between an incident angle at which the interference signal is the smallest on the substrate before the substrate processing and an incident angle at which the interference signal is the smallest on the substrate after the substrate processing.

8. The substrate processing method of claim 2, wherein, in the specifying process, a Brewster's angle is calculated through arithmetic operation from refractive indices of the pattern portion formed on the substrate and a base layer of the pattern portion, and the first incident angle and the second incident angle are specified from a predetermined angle range with reference to the calculated Brewster's angle.

9. The substrate processing method of claim 2, wherein, in the specifying process, the first incident angle and the second incident angle are specified as a same angle.

10. The substrate processing method of claim 1, wherein the first incident angle and the second incident angle are incident angles within a predetermined angle range with reference to a Brewster's angle of the emitted P-polarized infrared light with respect to the substrate.

11. The substrate processing method of claim 1, wherein the first incident angle and the second incident angle are set to a same angle.

12. The substrate processing method of claim 1, wherein the one or more recesses of the pattern in the substrate has a depth of 700 nm or more.

13. The substrate processing method of claim 1, wherein, in the extraction process, the difference spectrum indicating absorbance of infrared light for each wavenumber is extracted by subtracting the spectrum of the transmitted light or reflected light measured in the first measuring process from the spectrum of the transmitted light or reflected light measured in the second measuring process.

14. The substrate processing method of claim 1, further comprising:

a display process of displaying a state of the substrate subjected to the substrate processing in the substrate processing process based on the difference spectrum extracted in the extraction process.

15. The substrate processing method of claim 1, further comprising:

a control process of controlling a process parameter of the substrate processing process based on the difference spectrum extracted in the extraction process.

16. The substrate processing method of claim 15, wherein, in the control process, the process parameter of the substrate processing process is controlled based on a comparison of inter-substrate difference spectra from the difference spectra of the plurality of substrates.

17. The substrate processing method of claim 15, wherein the first measuring process and the second measuring process are performed at each of multiple in-plane locations of the substrate, and wherein, in the control process, a difference spectrum between the spectrum of the transmitted light or reflected light measured in the first measuring process and the spectrum of the transmitted light or reflected light measured in the second measuring process is extracted at each of multiple locations, and a process parameter is controlled based on the difference spectra of the multiple locations.

18. The substrate processing method of claim 17, wherein the substrate processing process is a process of forming a film on the substrate on which the pattern comprising the one or more recesses is formed, and wherein, in the control process, a film thickness distribution and film quality of the film formed on the substrate are determined from the difference spectra of the multiple locations, and the process parameter is controlled to achieve a predetermined film quality while making the film thickness distribution uniform.

19. The substrate processing method of claim 17, wherein the substrate processing process is a process of etching the substrate, and wherein, in the control process, a volume distribution and composition of the etched film are determined from the difference spectra of the multiple locations, and the process parameter is controlled such that a predetermined film is etched while making an etched amount distribution uniform.

20. The substrate processing method of claim 1, wherein, the substrate processing process is performed on the substrate periodically under a same processing condition, and wherein the substrate processing method further comprises:

a diagnosis process of diagnosing the condition of an apparatus that performs the substrate processing process based on a comparison of inter-substrate difference spectra from the difference spectra of the plurality of substrates subjected to the substrate processing under the same processing condition.

21. A substrate processing apparatus comprising:

a processing container configured to be airtight;

a stage on which a substrate on which a pattern comprising one or more recesses is formed is placed, the stage being provided within the processing container;

a substrate processor configured to perform substrate processing on the substrate on the stage and including a shower head and a gas supplier;

a measurement part configured to perform a measurement by infrared spectroscopy by emitting P-polarized infrared light to the substrate on the stage; and a controller configured to perform control to: measure, by the measurement part, light transmitted through or reflected from the substrate by emitting P-polarized infrared light at a first incident angle onto the substrate before the substrate processing; and perform, by the substrate processor, the substrate processing on the substrate; measure, by the measurement part, light transmitted through or reflected from the substrate by emitting P-polarized infrared light at a second incident angle onto the substrate after the substrate processing; and execute a difference spectrum between a spectrum indicating absorbance of the measured infrared light for each wavenumber of the light transmitted through or reflected from the substrate before the substrate processing and a spectrum indicating absorbance of the measured infrared light for each wavenumber of light transmitted through or reflected from the substrate after the substrate processing, wherein the first incident angle and the second incident angle are incident angles at which an interference signal becomes smaller than a change caused by light absorption by the substrate in the spectrum of the transmitted light or reflected light obtained when each of the P-polarized infrared lights emitted at the first incident angle and the second incident angle is transmitted through or reflected from the substrate.

* * * * *